US011016331B2

(12) United States Patent
Lee et al.

(10) Patent No.: US 11,016,331 B2
(45) Date of Patent: May 25, 2021

(54) DISPLAY PANEL AND METHOD FOR FABRICATING THE SAME

(71) Applicant: SAMSUNG DISPLAY CO., LTD., Yongin-si (KR)

(72) Inventors: Chang-hun Lee, Hwaseong-si (KR); Min-jae Kim, Suwon-si (KR); Min-hee Kim, Ansan-si (KR); Taehoon Kim, Suwon-si (KR); Kyunghae Park, Seongnam-si (KR); Joon-hyoung Park, Seoul (KR); Danbi Yang, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/539,857

(22) Filed: Aug. 13, 2019

(65) Prior Publication Data
US 2020/0110303 A1 Apr. 9, 2020

(30) Foreign Application Priority Data

Oct. 4, 2018 (KR) ........................ 10-2018-0117993

(51) Int. Cl.
*H01L 27/32* (2006.01)
*G02F 1/13357* (2006.01)
(Continued)

(52) U.S. Cl.
CPC .... *G02F 1/133516* (2013.01); *G02F 1/13394* (2013.01); *G02F 1/133512* (2013.01);
(Continued)

(58) Field of Classification Search
CPC ... G02F 1/133617; G02F 2001/133614; H01L 27/322; H01L 51/5012; H01L 51/502;
(Continued)

(56) References Cited

U.S. PATENT DOCUMENTS 9,766,760 B2 9/2017 Jeon et al.
10,070,538 B2 9/2018 Park et al.
(Continued)

FOREIGN PATENT DOCUMENTS

KR 10-2015-0103783 A 9/2015
KR 10-2015-0145152 A 12/2015
KR 10-1710188 B1 2/2017

OTHER PUBLICATIONS

English language translation of WIPO patent application No. WO2013080947. Application downloaded from Espacenet at worldwide.espacenet.com on Jul. 31, 2020; machine language translation from Chinese into English provided by Google Translate tool on-site. (Year: 2013).*

*Primary Examiner* — Angela K Davison
(74) *Attorney, Agent, or Firm* — Lewis Roca Rothgerber Christie LLP

(57) ABSTRACT

A display panel includes an upper display substrate and a lower display substrate. The upper display substrate includes a base substrate, a first partition wall on the base substrate, overlapping the light blocking area, and configured to define first, second, and third internal regions corresponding to the first, second, and third pixel areas, a second partition wall extending from the first partition wall, overlapping at least one area of the first, second, and third pixel areas, and configured to partition a region corresponding to the at least one area into partial regions, and first, second, and third color control layers respectively located in the first, second, and third internal regions.

11 Claims, 19 Drawing Sheets

(51) Int. Cl.
  *G02F 1/1335* (2006.01)
  *G02F 1/1339* (2006.01)
  *G02F 1/1343* (2006.01)
  *H01L 51/52* (2006.01)
  *H01L 51/56* (2006.01)
  *G02F 1/1368* (2006.01)

(52) U.S. Cl.
  CPC .. *G02F 1/133617* (2013.01); *G02F 1/134309* (2013.01); *H01L 27/322* (2013.01); *H01L 51/524* (2013.01); *H01L 51/5209* (2013.01); *H01L 51/5225* (2013.01); *H01L 51/5253* (2013.01); *H01L 51/5284* (2013.01); *H01L 51/56* (2013.01); *G02F 1/1368* (2013.01); *G02F 2201/52* (2013.01); *H01L 27/3244* (2013.01); *H01L 2251/5369* (2013.01)

(58) Field of Classification Search
  CPC .... H01L 33/50; H01L 33/502; H01J 2329/20; H01J 2329/28; H01J 2329/32; H01J 2329/323; H01J 2329/326
  See application file for complete search history.

(56) References Cited

U.S. PATENT DOCUMENTS

| | | |
|---|---|---|
| 2008/0024539 A1 | 1/2008 | Kotani et al. |
| 2009/0115952 A1* | 5/2009 | Nakamura ............... G02B 5/23 349/143 |
| 2015/0185381 A1* | 7/2015 | Wu ................... G02F 1/133617 349/106 |

* cited by examiner ing to the at least one area into partial regions; and first, second, and third color control layers respectively located in the first, second, and third internal regions.

DISPLAY PANEL AND METHOD FOR FABRICATING THE SAME

CROSS-REFERENCE TO RELATED APPLICATION

This patent application claims priority to and the benefit of Korean Patent Application No. 10-2018-0117993, filed on Oct. 4, 2018 in the Korean Intellectual Property Office, the entire content of which is hereby incorporated by reference.

BACKGROUND

1. Field

Aspects of embodiments of the present disclosure relate to a display panel and a method for fabricating the same.

2. Description of Related Art

A display panel includes a transmissive display panel selectively transmitting source light generated from a light source and an emission type display panel generating source light in the display panel itself. The display panel may include different kinds of color control layers according to pixels to generate a color image. The color control layer may transmit only a portion of a wavelength range of source light or may convert a color of the source light. A portion of the color control layer may not convert the color of the source light but convert characteristics of the light.

SUMMARY

According to an aspect of embodiments of the present disclosure a display panel including a partition wall is provided. According to another aspect of embodiments of the present disclosure a display panel, which is reduced in pixel defect, is provided.

According to another aspect of embodiments of the present disclosure a method for fabricating a display panel that is simplified in fabrication process is provided.

According to one or more embodiments of the inventive concept, a display panel includes an upper display substrate and a lower display substrate. The upper display substrate includes first, second, and third pixel areas and a light blocking area around the first, second, and third pixel areas. The lower display substrate includes first, second, and third display elements corresponding to the first, second, and third pixel areas. The upper display substrate includes: a base substrate; a first partition wall on the base substrate, overlapping the light blocking area, and configured to define first, second, and third internal regions corresponding to the first, second, and third pixel areas; a second partition wall overlapping at least one area of the first, second, and third pixel areas, and configured to partition a region correspond- In an embodiment, each of the first, second, and third display elements may include a first electrode, a second electrode, and a light emitting layer between the first electrode and the second electrode, and the light emitting layers of the first, second, and third display elements may have an integrated shape to generate blue light.

In an embodiment, the first color control layer may include a first quantum dot to convert the blue light into red light, the second color control layer may include a second quantum dot to convert the blue light into green light, and the third color control layer may be configured to transmit the blue light.

In an embodiment, the region corresponding to the at least one area may be the first internal region, and the second partition wall may overlap the first electrode of the first display element.

In an embodiment, the second partition wall may extend in a first direction, and the second partition wall may be arranged such that the first electrode of the first display element is bisected in a second direction perpendicular to the first direction.

In an embodiment, the partial regions may have a same surface area on a plane.

In an embodiment, the first pixel area may have a surface area greater than that of each of the second and third pixel areas on a plane.

In an embodiment, the upper display substrate may further include: a black matrix on the base substrate to overlap the light blocking area; red, green, and blue color filters on the base substrate to respectively correspond to the first, second, and third pixel areas; a first encapsulation layer covering the red color filter, the green color filter, and the blue color filter; and a second encapsulation layer covering the first partition wall, the second partition wall, and the first, second, and third color control layers.

In an embodiment, the second partition wall may partition each of the first, second, and third internal regions into the partial regions.

In an embodiment, the display panel may further include a liquid crystal layer between the upper display substrate and the lower display substrate.

In an embodiment, the first color control layer may include a red color filter, the second color control layer may include a green color filter, and the third color control layer may include a blue color filter.

According to one or more embodiments of the inventive concept, a display panel includes an upper display substrate and a lower display substrate. The lower display substrate include a first electrode, a second electrode having a surface area greater than that of the first electrode, and a light emitting layer between the first electrode and the second electrode. The upper display substrate includes: a base substrate; a black matrix on the base substrate and in which an opening corresponding to the first electrode is defined; a partition wall comprising a first portion overlapping the black matrix and having a closed line shape on a plane, and a second portion overlapping the opening and extending from a side of the first portion to another side of the first portion; and first and second quantum dots respectively located in two partitioned regions defined by the first portion and the second portion.

In an embodiment, the first and second quantum dots may include a same material. In an embodiment, the second portion may bisect the first electrode on the plane.

According to one or more embodiments of the inventive concept, a method for fabricating a display panel includes: forming a first display substrate comprising first, second, and third display elements; forming a second display substrate comprising first, second, and third pixel areas corresponding to the first, second, and third display elements, and a light blocking area around the first, second, and third pixel areas; and coupling the first display substrate to the second display substrate.

The forming of the second display substrate includes: forming a black matrix on a base substrate to overlap the light blocking area; forming a partition wall, which comprises a first portion defining first, second, and third internal regions corresponding to the first, second, and third pixel areas, and a second portion extending from the first portion, overlapping the first pixel area, and partitioning the first internal region into two partial regions, on the base substrate; forming a first portion of a first color control layer in one partial region of the two partial regions, and forming a second color control layer in the second internal region; and forming a second portion of the first color control layer in the other partial region of the two partial regions, and forming a third color control layer in the third internal region.

In an embodiment, a first color composition may be provided in the one partial region, and a second color composition different from the first color composition may be provided in the second internal region.

In an embodiment, the first color composition may include a solvent and a solid content dispersed in the solvent, the solid content may be in a range of about 20 wt % to about 30 wt % on the basis of the first color composition, and the solid content may include a base resin and a quantum dot.

In an embodiment, a same composition as the first color composition may be provided in the other partial region.

In an embodiment, the method may further include: drying the first color composition and the second color composition in a vacuum state to form a first preliminary color control layer and a second preliminary color control layer; first baking the first preliminary color control layer and the second preliminary color control layer at a first temperature; and second baking the first preliminary color control layer and the second preliminary color control layer at a second temperature greater than the first temperature.

In an embodiment, the forming of the partition wall may further include forming a second portion that partitions each of the second internal region and the third internal region into two partial regions.

BRIEF DESCRIPTION OF THE DRAWINGS

The accompanying drawings are included to provide a further understanding of the inventive concept, and are incorporated in and constitute a part of this specification. The drawings illustrate some example embodiments of the inventive concept and, together with the description, serve to explain principles of the inventive concept. In the drawings.

DETAILED DESCRIPTION

Figure 1A:
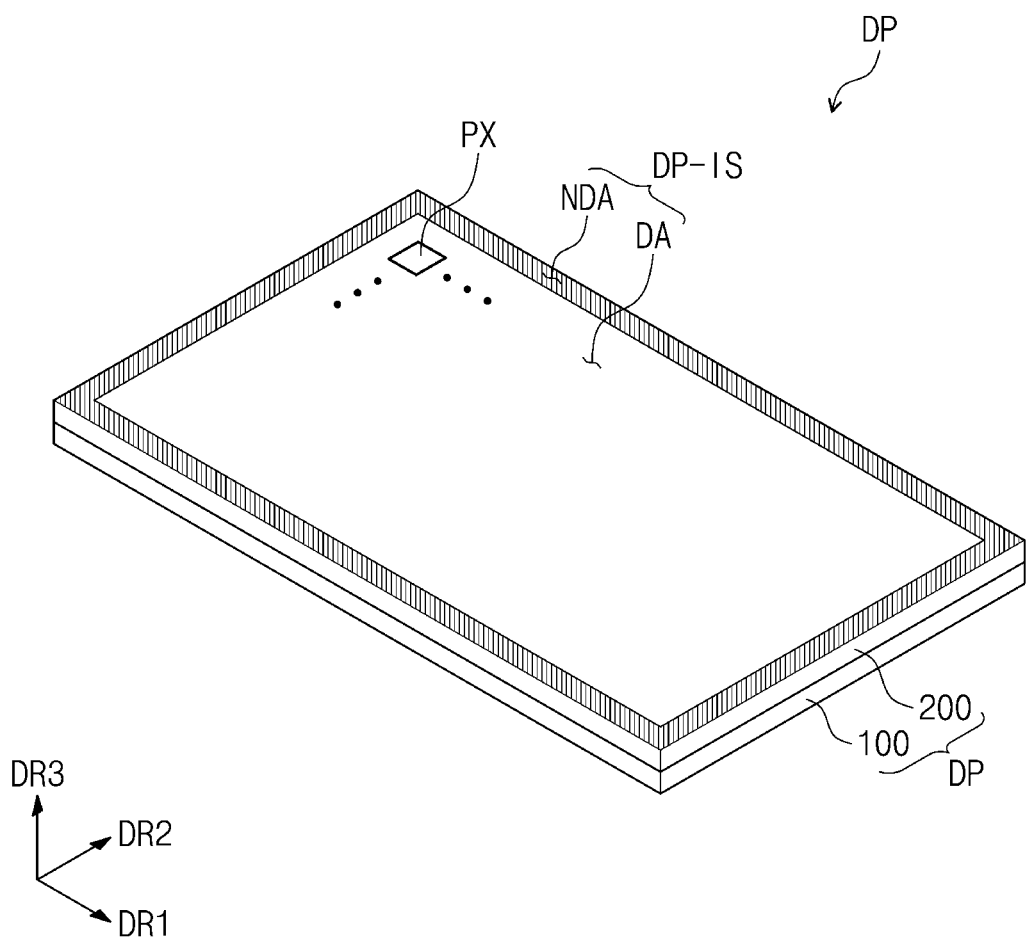
FIG. 1A is a perspective view of a display panel according to an embodiment of the inventive concept.

The present disclosure may have diverse and modified embodiments, although some specific embodiments are illustrated in the drawings and are described in the detailed description of the inventive concept. However, this does not limit the present disclosure within specific embodiments and it is to be understood that the present disclosure covers all the modifications, equivalents, and replacements within the concept and technical scope of the present disclosure.

Like reference numerals refer to like elements throughout. In the drawings, the dimensions and size of each structure may be exaggerated or reduced for convenience in description and clarity. It is to be understood that although terms such as "first" and "second" are used herein to describe various elements, these elements should not be limited by these terms. These terms are used to distinguish one component from other components. For example, a first element referred to as a "first" element in one embodiment can be referred to as a "second" element in another embodiment without departing from the scope of the appended claims. The terms of a singular form may include plural forms unless referred to the contrary.

The meaning of "include" or "comprise" specifies a property, a region, a fixed number, a step, a process, an element, and/or a component, but does not exclude other properties, regions, fixed numbers, steps, processes, elements, and/or components.

Also, spatially relative terms, such as "below," "lower," "above," and "upper," may be used herein for ease of description to describe an element and/or a feature's relationship to another element(s) and/or feature(s) as illustrated in the drawings. However, the terms are relative concepts and described with respect to the direction indicated in the drawings. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Where an element is described as being related to another element, such as being "on" another element or "located on" a different element or a layer, this includes both a case in which an element is located directly on another element or a layer and a case in which an element is located on another element via another layer or still another element. In contrast, where an element is described as being related to another element, such as being "directly on" another element or "located directly on" a different element or a layer, this indicates a case in which an element is located on another element or a layer with no intervening element or layer therebetween.

The terminology used herein is for the purpose of describing particular embodiments and is not intended to be limiting of example embodiments. As used herein, the singular forms "a," "an," and "the" are intended to include the plural forms as well, unless the context clearly indicates otherwise.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
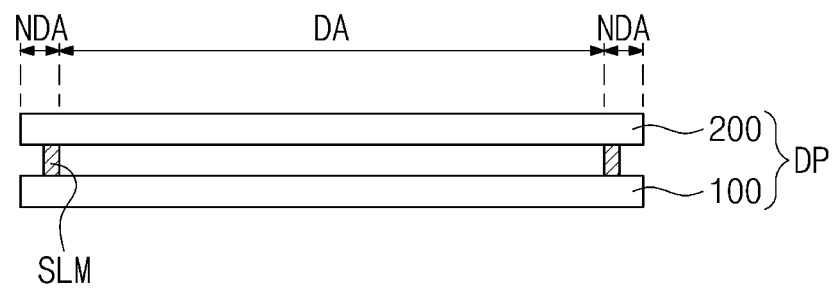
FIG. 1B is a cross-sectional view of the display panel according to an embodiment of the inventive concept.

FIG. 1A is a perspective view of a display panel DP according to an embodiment of the inventive concept; FIG. 1B is a cross-sectional view of the display panel DP according to an embodiment of the inventive concept; and FIG. 2 is a plan view of the display panel DP according to an embodiment of the inventive concept.

Figure 1B:
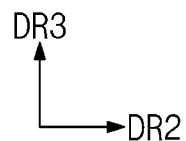
Figure 2:
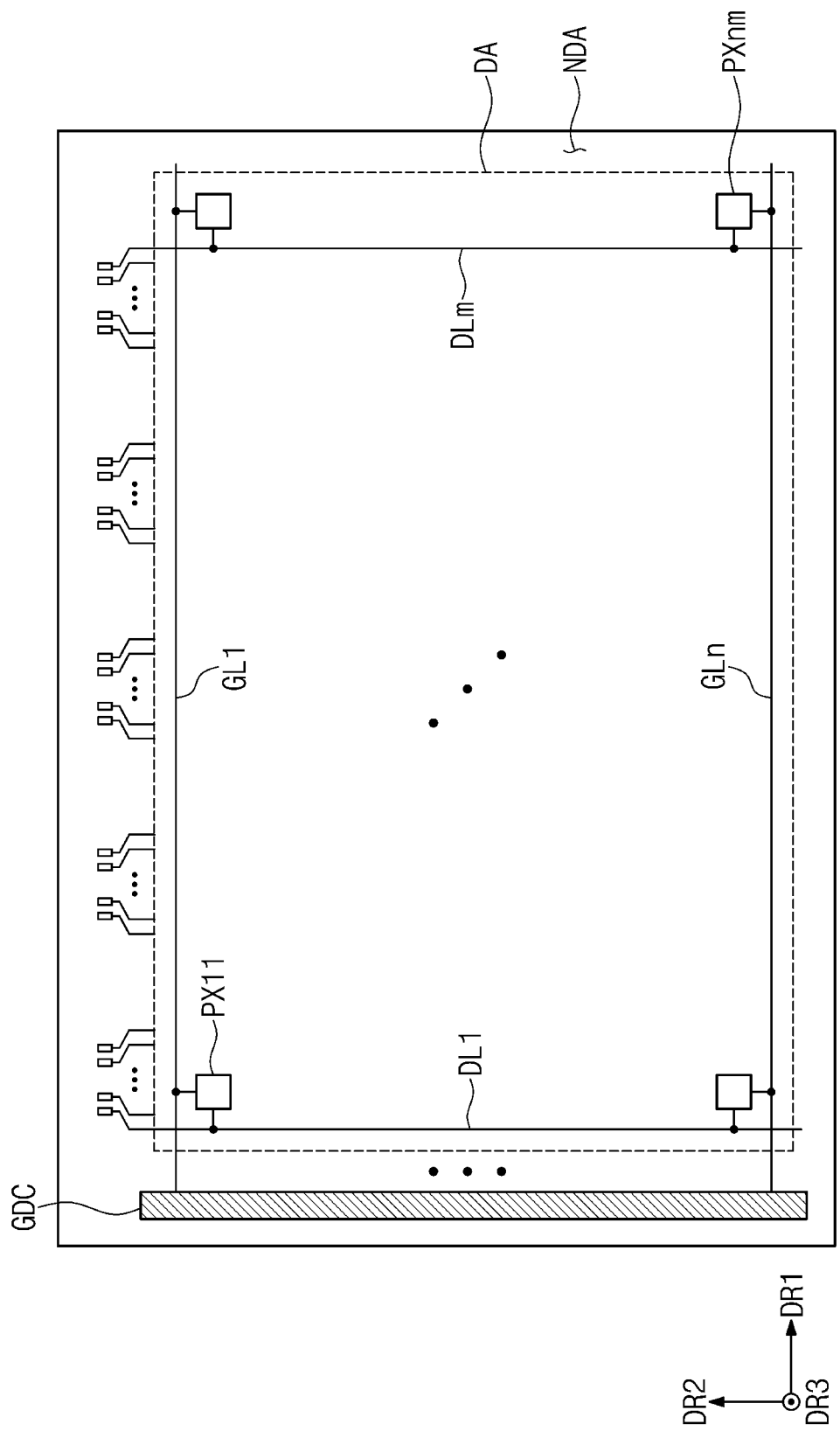
FIG. 2 is a plan view of the display panel according to an embodiment of the inventive concept.

Referring to FIGS. 1A to 2, the display panel DP may be one of a liquid crystal display panel, an electrophoretic display panel, a microelectromechanical system (MEMS) display panel, an electrowetting display panel, and an organic light emitting display panel, but is not specifically limited thereto.

Although not separately shown, the display panel DP may further include a chassis member of a molding member and also may further include a backlight unit according to a kind of the display panel DP.

The display panel DP may include a first display substrate 100 (or a lower display substrate) and a second display substrate 200 (or an upper display substrate) spaced apart from the first display substrate 100 to face the first display substrate 100. A cell gap (e.g., a predetermined cell gap) may be defined between the first display substrate 100 and the second display substrate 200. The cell gap may be maintained by a sealant SLM through which the first display substrate 100 and the second display substrate 200 are coupled to each other. A gradation display layer for generating an image may be disposed between the first display substrate 100 and the second display substrate 200. The gradation display layer may include a liquid crystal layer, an organic light emitting layer, and an electrophoretic layer according to the kind of display panel.

As illustrated in FIG. 1A, the display panel DP may display an image through a display surface DP-IS. The display surface DP-IS is parallel to a surface defined by a first directional axis DR1 and a second directional axis DR2. The display surface DP-IS may include a display area DA and a non-display area NDA. A pixel PX is disposed on the display area DA and is not disposed on the non-display area NDA. In an embodiment, the non-display area NDA is defined along an edge of the display surface DP-IS. In an embodiment, the display area DA may be surrounded by the non-display area NDA.

A normal direction of the display surface DP-IS, i.e., a thickness direction of the display panel DP is indicated as a third directional axis DR3. A front surface (or a top surface) and a rear surface (or a bottom surface) of each of layers or units, which will be described below, are distinguished by the third directional axis DR3. However, the first to third directional axes illustrated in this embodiment may be merely examples. Herein, first to third directions may be directions indicated by the first to third directional axes DR1, DR2, and DR3 and designated by the same reference numerals, respectively.

Although the display panel DP having a planar display surface DP-IS is illustrated in an embodiment of the inventive concept, embodiments of the inventive concept are not limited thereto. In an embodiment, the display panel DP may include a curved display surface or a solid display surface. The solid display surface may include a plurality of display areas that indicate different directions.

FIG. 2 illustrates an arrangement relationship between signal lines GL1 to GLn, DL1 to DLm, PL-G, and PL-D and pixels PX11 to PXnm on a plane. The signal lines GL1 to GLn, DL1 to DLm, PL-G, and PL-D may include a plurality of gate lines GL1 to GLn, and a plurality of data lines DL1 to DLm.

Each of the pixels PX11 to PXnm are connected to the corresponding gate lines of the plurality of gate lines GL1 to GLn and the corresponding data lines of the plurality of data lines DL1 to DLm, respectively. Each of the pixels PX11 to PXnm may include a pixel driver circuit and a display element. More kinds of signal lines may be provided on the display panel DP according to a configuration of the pixel driving circuit of the pixels PX11 to PXnm.

Although the pixels PX11 to PXnm having the form of a matrix are illustrated as an example, embodiments of the inventive concept are not limited thereto. In an embodiment, the pixels PX11 to PXnm may be disposed in the form of a pentile. In an embodiment, the pixels PX11 to PXnm may be disposed in the form of a diamond. A gate driver circuit GDC may be integrated with the display panel DP through an oxide silicon gate driver circuit (OSG) process or an amorphous silicon gate driver circuit (ASG) process.

Figure 3A:
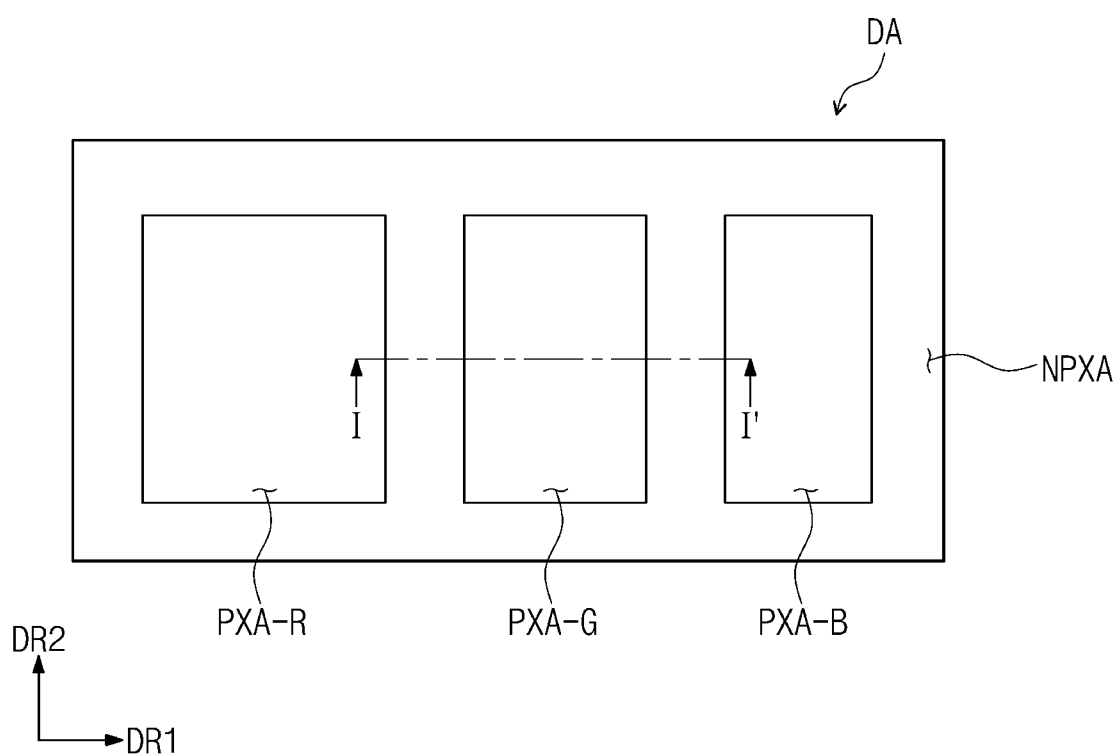
FIG. 3A is a plan view illustrating pixel areas of the display panel according to an embodiment of the inventive concept.
Figure 3B:
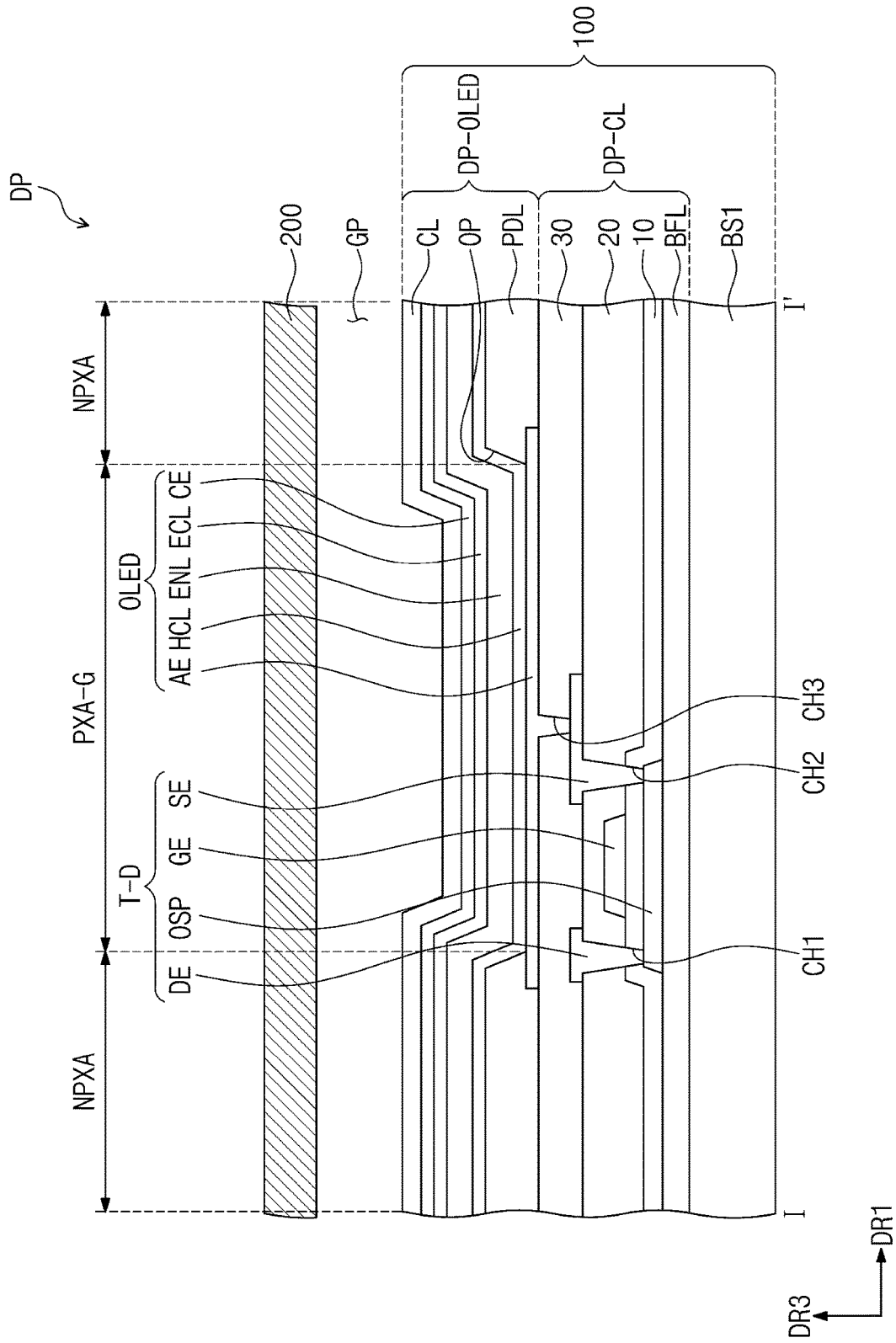
FIG. 3B is a cross-sectional view illustrating a pixel area of the display panel according to an embodiment of the inventive concept.
Figure 3C:
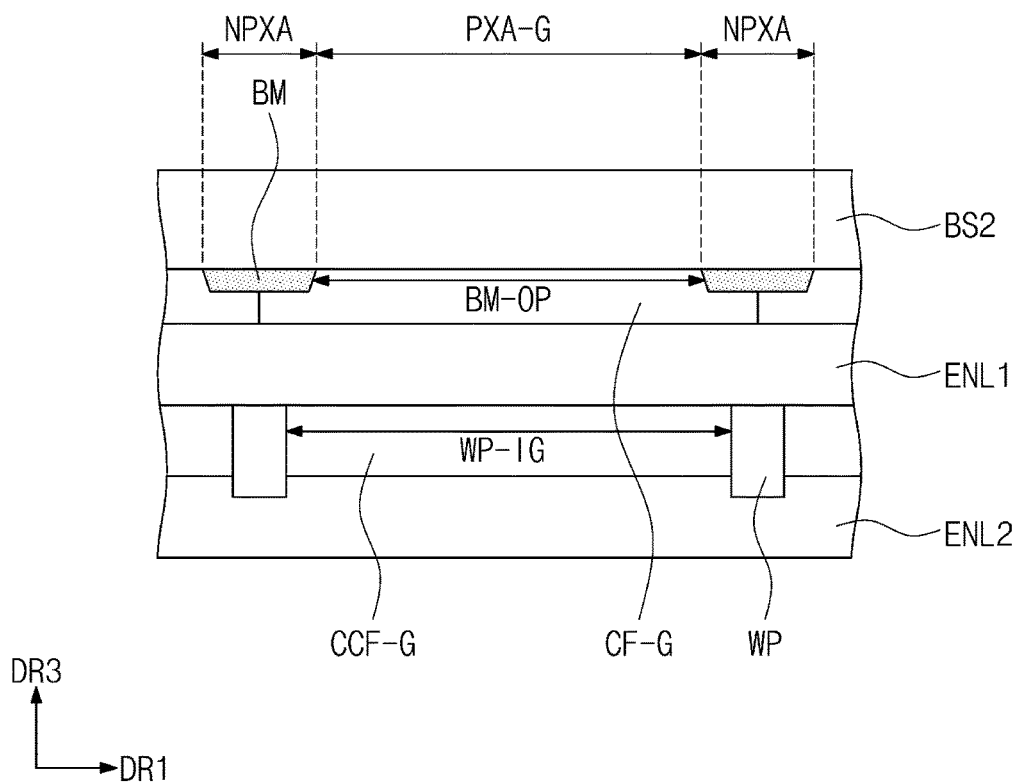
FIGS. 3C to 3E are cross-sectional views of a pixel area of an upper display substrate according to an embodiment of the inventive concept.
Figure 3D:
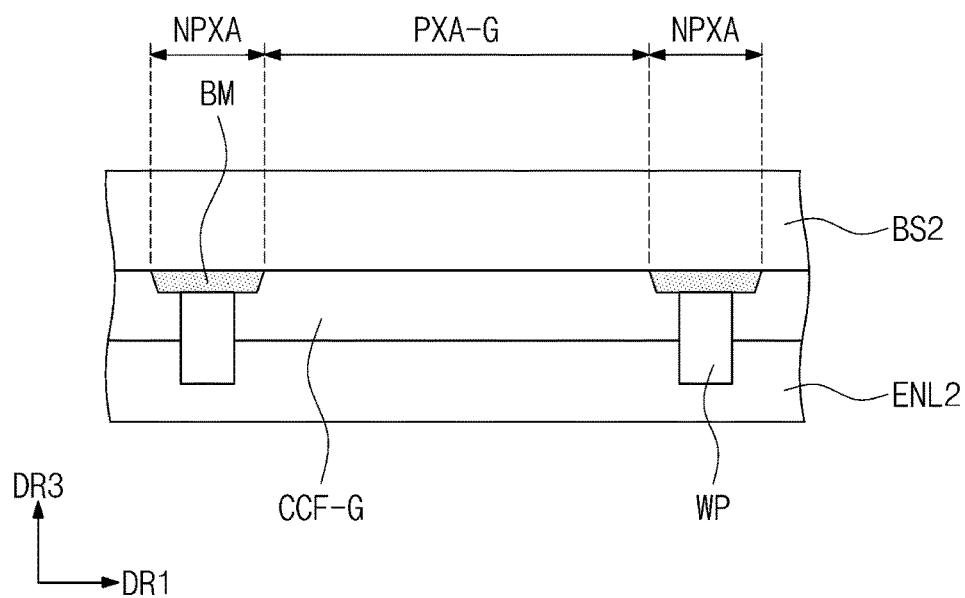
Figure 3E:
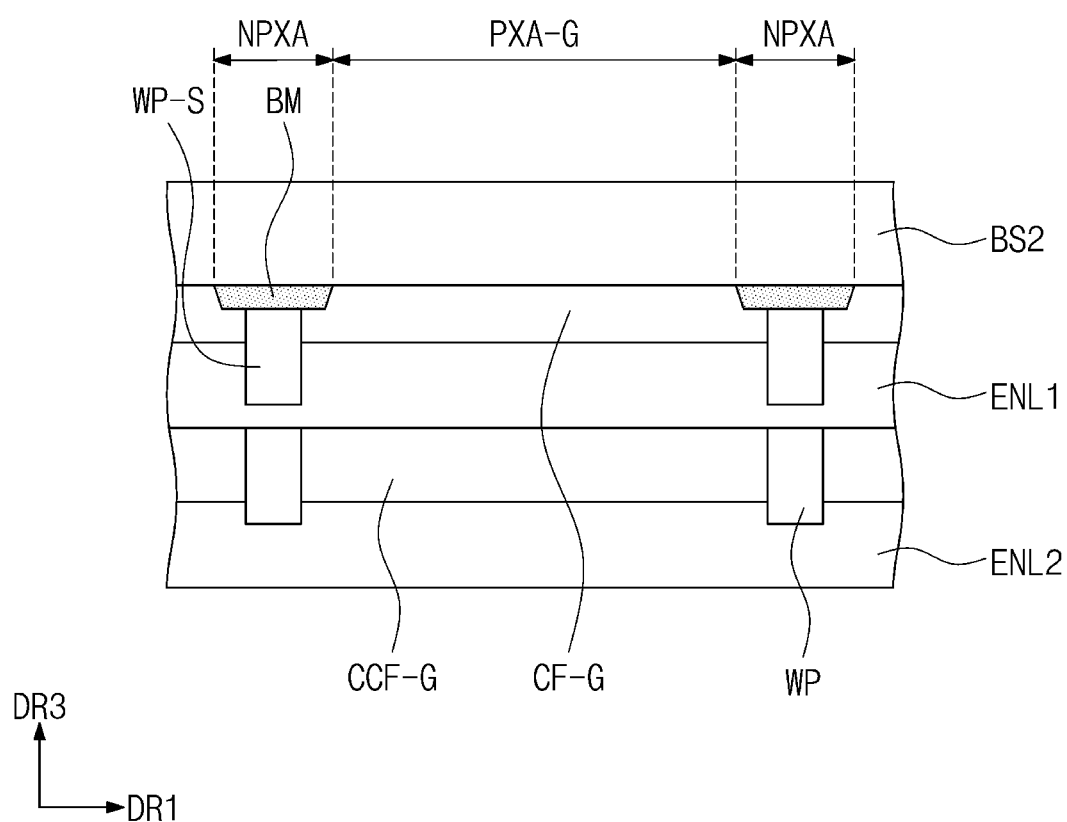

FIG. 3A is a plan view illustrating pixel areas PXA-R, PXA-G, and PXA-B of the display panel DP according to an embodiment of the inventive concept. FIG. 3B is a cross-sectional view illustrating the pixel area PXA-G of the display panel DP according to an embodiment of the inventive concept. FIGS. 3C to 3E are cross-sectional views of a pixel area of an upper display substrate 200 according to an embodiment of the inventive concept.

FIG. 3A is a partial enlarged view of the display area DA of FIG. 1A. Three kinds of pixel areas PXA-R, PXA-G, and PXA-B will be mainly illustrated. The three kinds of pixel areas PXA-R, PXA-G, and PXA-B of FIG. 3A may be repeatedly disposed throughout the display area DA.

A light blocking area NPXA is disposed around the first to third pixel areas PXA-R, PXA-G, and PXA-B. The light blocking area NPXA sets a boundary between the first to third pixel areas PXA-R, PXA-G, and PXA-B to prevent or substantially prevent colors from being mixed with each other between the first to third pixel areas PXA-R, PXA-G, and PXA-B.

Although the first to third pixel areas PXA-R, PXA-G, and PXA-B having different surface areas on the plane are exemplified in an embodiment, embodiments of the inventive concept are not limited thereto. At least two surface areas of the first to third pixel areas PXA-R, PXA-G, and PXA-B may be the same. Although the first to third pixel areas PXA-R, PXA-G, and PXA-B, each of which has a rectangular shape on the plane, are illustrated in this embodiment, embodiments of the inventive concept are not limited thereto. The first to third pixel areas PXA-R, PXA-G, and PXA-B may have other polygonal shapes on the plane. Alternatively, each of first to third pixel areas PXA-R, PXA-G, and PXA-B may have a rectangular shape having a rounded corner area or a regular polygon shape having a rounded corner area.

One of the first to third pixel areas PXA-R, PXA-G, and PXA-B provides first color light corresponding to source light, another one provides second color light different from the first color light, and the remaining one provides third color light different from the first color light and the second color light. In an embodiment, the third pixel area PXA-B provides the first color light. In an embodiment, the first pixel area PXA-R may provide red light, the second pixel area PXA-G may provide green light, and the third pixel area PXA-B may provide blue light.

A portion (herein, referred to as reflected light) of light incident into the display area DA from the outside is reflected from the first to third pixel areas PXA-R, PXA-G, and PXA-B. The reflected light may be different in wavelength range and spectrum according to the first to third pixel areas PXA-R, PXA-G, and PXA-B. The first to third pixel areas PXA-R, PXA-G, and PXA-B may be adjusted in surface area so as to control the reflected light that is reflected by the entire display area DA such that the reflected light does not have a specific color. In an embodiment, the first pixel area PXA-R providing the red light may have the largest surface area, and the third pixel area PXA-B providing the blue light may have the smallest surface area.

FIG. 3B illustrates a cross-sectional view of the display panel DP corresponding to the second pixel area PXA-G. FIG. 3B illustrates an example of the cross-section corresponding to a driving transistor T-D and a light emitting element OLED. In FIG. 3B, the upper display substrate 200 is schematically illustrated. The upper display substrate 200 and the lower display substrate 100 may form a gap (e.g., a predetermined gap).

As illustrated in FIG. 3B, the lower display substrate 100 includes a first base substrate BS1, a circuit element layer DP-CL disposed on the first base substrate BS1, a display element layer DP-OLED disposed on the circuit element layer DP-CL, and a display element layer DP-OLED.

The first base substrate BS1 may include a synthetic resin substrate or a glass substrate. The circuit element layer DP-CL includes at least one insulation layer and a circuit element. The circuit element includes the signal line and the driver circuit of the pixel. The circuit element layer DP-CL may be formed through a process of forming an insulation, a semiconductor layer, and a conductive layer by coating or deposition and a process of patterning the insulation, the semiconductor layer, and the conductive layer by a photolithography process.

In an embodiment, the circuit element layer DP-CL may include a buffer layer BFL, a first insulation layer 10, a second insulation layer 20, and a third insulation layer 30. In an embodiment, each of the first insulation layer 10 and the second insulation layer 20 may be an inorganic layer, and the third insulation layer 30 may be an organic layer.

FIG. 3B illustrates an example of an arrangement relationship of a semiconductor pattern OSP, a control electrode GE, an input electrode DE, and an output electrode SE, which constitute the driving transistor T-D. First, second, and third through-holes CH1, CH2, and CH3 are illustrated exemplarily.

The display element layer DP-OLED includes a light emitting element or diode OLED. The light emitting element OLED may generate the above-described source light. The light emitting element OLED includes a first electrode, a second electrode, and a light emitting layer disposed between the first and second electrodes. In an embodiment, the display element layer DP-OLED may include an organic light emitting diode as the light emitting diode. The display element layer DP-OLED includes a pixel defining layer PDL. For example, the pixel defining layer PDL may be an organic layer.

A first electrode AE is disposed on the intermediate organic layer 30. The first electrode AE is connected to the output electrode SE through the third through-hole CH3 passing through the third insulation layer or intermediate organic layer 30. An opening OP is defined in the pixel defining layer PDL. The opening OP of the pixel defining layer PDL exposes at least a portion of the first electrode AE. In the current embodiment, the light emitting area PXA-G may be defined to correspond to a portion of the first electrode AE exposed by the opening OP.

In an embodiment, a hole control layer HCL, a light emitting layer EML, and an electron control layer ECL may be commonly disposed on the pixel area PXA-G and the light blocking area NPXA. In an embodiment, the hole control layer HCL, the light emitting layer EML, and the electron control layer ECL may be commonly disposed on the first to third pixel areas PXA-R, PXA-G, and PXA-B.

The hole control layer HCL may include a hole transport layer and may further include a hole injection layer. The light emitting layer EML may generate blue light. The blue light may include a wavelength of about 410 nm to about 480 nm. An emission spectrum of the blue light may have a maximum peak within a wavelength of about 440 nm to about 460 nm. The electron control layer ECL may include an electron transport layer and may further include an electron injection layer.

A second electrode CE is disposed on the electron control layer ECL. The second electrode CE may be commonly disposed on the first to third pixel areas PXA-R, PXA-G, and PXA-B. Thus, the second electrode CE may have a surface area greater than that of the first electrode AE. A cover layer CL protecting the second electrode CE may be further disposed on the second electrode CE. The cover layer CL may include an organic material or an inorganic material.

The lower display substrate 100 may include first, second, and third display elements corresponding to the first to third pixel areas PXA-R, PXA-G, and PXA-B of FIG. 3A. The first, second, and third display elements may have the same laminated structure as each other and also may have the same laminated structure as the light emitting element OLED of FIG. 3B.

Referring to FIGS. 3A and 3B, the first, second, and third elements have surface areas corresponding to the first to third pixel areas PXA-R, PXA-G, and PXA-B on the plane and thus may have surface areas different from each other. Particularly, the first electrode AE of the first display element may have the largest surface area, and the first electrode AE of the third display element may have the smallest surface area.

As illustrated in FIG. 3C, the upper display substrate 200 may include a second base substrate BS2, a black matrix BM disposed on a bottom surface of the second base substrate BS2, a color filter CF-G, a partition wall WP, and a color conversion layer CCF-G. In an embodiment, each of the color filter CF-G and the color conversion layer CCF-G may be a color control layer that converts characteristics of incident light.

The second base substrate BS2 may include a synthetic resin substrate or a glass substrate. The black matrix BM is disposed on the bottom surface of the second base substrate BS2. The black matrix BM is disposed on the light blocking area NPXA. Openings corresponding to the first to third pixel areas PXA-R, PXA-G, and PXA-B of FIG. 3A are defined in the black matrix BM. One opening BM-OP is illustrated in FIG. 3C. The opening BM-OP may correspond to the first electrode AE of FIG. 3B. The opening BM-OP may correspond to the opening OP of the pixel defining layer PDL of FIG. 3B.

The color filter CF-G is disposed on the bottom surface of the base substrate BS2. The color filter CF-G includes a base resin and a dye and/or pigment dispersed in the base resin. The color filter CF-G overlaps the pixel area PXA-G. An edge area of the color filter CF-G may overlap the light blocking area NPXA. A portion of the black matrix BM may be disposed between the color filter CF-G and the bottom surface of the second base substrate BS2.

Referring to FIGS. 3A to 3C, first to third color filters are disposed to correspond to the first to third pixel areas PXA-R, PXA-G, and PXA-B. The first to third color filters may include a dye and/or pigment that absorbs wavelength bands different from each other. In an embodiment, the first color filter may be a red color filter, the second color filter may be a green color filter, and the third color filter may be a blue color filter. The second color filter may be the color filter CF-G of FIG. 3C. The first to third color filters may reduce reflection of external light. Each of the first to third color filters transmits light having a specific wavelength range and blocks light having a corresponding wavelength range.

A first encapsulation layer ENL1 is disposed on the color filter CF-G. The first encapsulation layer ENL1 seals the color filter CF-G. The first encapsulation layer ENL1 may be commonly disposed on the first to third pixel areas PXA-R, PXA-G, and PXA-B.

The first encapsulation layer ENL1 may include an inorganic layer. In an embodiment, the first encapsulation layer ENL1 may include one of silicon oxide, silicon nitride, and silicon oxynitride. The first encapsulation layer ENL1 may further include an organic layer providing a flat bottom surface.

The partition wall WP is disposed on a bottom surface of the first encapsulation layer ENL1. The partition wall WP overlaps the light blocking area NPXA. The partition wall WP defines first to third internal regions (or internal spaces) corresponding to the first to third pixel areas PXA-R, PXA-G, and PXA-B. One internal region WP-IG is illustrated in FIG. 3C.

In a process of forming the color conversion layer CCF-G, the partition wall WP prevents or substantially prevents compositions different from each other from being mixed between the first to third pixel areas PXA-R, PXA-G, and PXA-B. Further description with respect to this function will be described with reference to a method for fabricating the display panel.

The color conversion layer CCF-G is disposed inside the partition wall WP. In an embodiment, the color conversion layer CCF-G may absorb the first color light generated from the light emitting element OLED of FIG. 3B to generate light having different colors. In an embodiment, the color conversion layer CCF-G may transmit and scatter the first color light.

In an embodiment, the color conversion layer CCF-G may include a base resin and quantum dots mixed or dispersed in the base resin. The base resin may be a medium in which the quantum dots are dispersed. In general, the base resin may include any of various resin compositions that are called binders. However, embodiments of the inventive concept are not limited thereto. In this specification, a medium capable of dispersing the quantum dots may be called the base resin (BR) regardless of its name, additional other functions, constituent materials, and the like. The base resin may be a polymer resin. For example, the base resin may include any of an acrylic-based resin, a urethane-based resin, a silicon-based resin, and an epoxy-based resin. The base resin may be a transparent resin.

The quantum dots may be particles that convert a wavelength of incident light. Each of the quantum dots may be a material having a crystal structure having a size of several nanometers. The quantum dot may be composed of hundreds to thousands of atoms to provide a quantum confinement effect in which an energy band gas increases due to the small size. When light having a wavelength with energy greater than that of the band gap is incident into the quantum dots, the quantum dots may absorb the light and thus be in an excited state to emit light having a specific wavelength, thereby becoming a ground state. The emitted light has a value corresponding to the band gap. When the quantum dots are adjusted in size and composition, light emitting characteristics due to the quantum confinement effect may be adjusted.

In an embodiment, the quantum dots may be selected from Group II-VI compounds, Group III-V compounds, Group IV-VI compounds, Group IV elements, Group IV compounds, and a combination thereof.

The Group II-VI compounds may be selected from binary element compounds selected from the group consisting of CdSe, CdTe, ZnS, ZnSe, ZnTe, ZnO, HgS, HgSe, HgTe, MgSe, MgS, and a combination thereof, ternary element compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compounds may be selected from binary element compounds selected from the group consisting of GaN, GaP, GaAs, GaSb, AlN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. The Group IV elements may be selected from the group consisting of Si, Ge, and a combination thereof. The Group IV compounds may be binary element compounds selected from the group consisting of SiC, SiGe, and a combination thereof.

Here, the binary element compounds, the ternary element compounds, and the quaternary element compounds may exist in the particle at a uniform concentration or exist in the particle in a state in which concentration distribution is partitioned into partially different states.

In an embodiment, the quantum dots may have a core-shell structure including a shell surrounding a core. Alternatively, the quantum dot may have a core-shell structure in which one quantum dot surrounds the other quantum dot. In an embodiment, an interface between the core and the shell may have a concentration gradient in which an element existing in the shell has a concentration that gradually decreases toward a center.

Each of the quantum dots may have a particle having a size of a nano scale. In an embodiment, the quantum dots may have a full width of half maximum (FWHM) of an emission wavelength spectrum of about 45 nm or less, and, in an embodiment, about 40 nm or less, and, in an embodiment, about 30 nm or less. In this range, color purity and color reproducibility may be improved. Also, light emitted through the quantum dots may be emitted in all directions to improve an optical viewing angle.

Also, each of the quantum dots may have a shape that is generally used in the art and is not specifically limited in shape. For example, the quantum dot may have a spherical shape, a pyramidal shape, a multi-arm shape, a cubic nanoparticle shape, a nanotube shape, a nanowire shape, a nanofiber shape, a nanoplate particle shape, or the like.

Referring to FIGS. 3A to 3C, first to third color conversion layers are disposed to correspond to the first to third pixel areas PXA-R, PXA-G, and PXA-B. The first color conversion layer absorbs the blue light to generate the red light, and the second color conversion layer absorbs the blue light to generate the green light. That is, the first color conversion layer and the second color conversion layer may include quantum dots different from each other. The third color conversion layer may transmit the blue light. The second color conversion layer may be the color conversion layer CCF-G of FIG. 3C. The first to third color conversion layers may further include scattering particles. In an embodiment, the scattering particles may be titanium oxide ($TiO_2$) or silica-based nanoparticles.

A second encapsulation layer ENL2 is disposed on the partition wall WP and the color conversion layer. The second encapsulation layer ENL2 seals the partition wall WP and the color conversion layer CCF-G. The second encapsulation layer ENL2 may be commonly disposed on the first to third pixel areas PXA-R, PXA-G, and PXA-B.

In an embodiment, the second encapsulation layer ENL2 may include an inorganic layer contacting the partition wall WP and the color conversion layer CCF-G. In an embodiment, the inorganic layer may include one of silicon oxide, silicon nitride, and silicon oxynitride. In an embodiment, the second encapsulation layer ENL2 may further include an organic layer disposed on the inorganic layer. The organic layer may provide a flat bottom surface.

FIGS. 3D and 3E illustrate an example of an upper display substrate 200 having a laminated structure different from that of the upper display substrate 200 of FIG. 3C.

As illustrated in FIG. 3D, the partition wall WP may be disposed on the black matrix BM. When compared to the upper display substrate 200 of FIG. 3C, the color filter CF-G and the first encapsulation layer ENL1 may be omitted.

As illustrated in FIG. 3E, a partition wall WP-S disposed on the black matrix BM may be further provided. The color filter CF-G of the partition wall WP-S may have substantially the same function as the color conversion layer CCF-G of the above-described partition wall WP. Although not separately shown, in an embodiment of the inventive concept, the partition wall WP of FIG. 3E may be omitted.

Figure 4A:
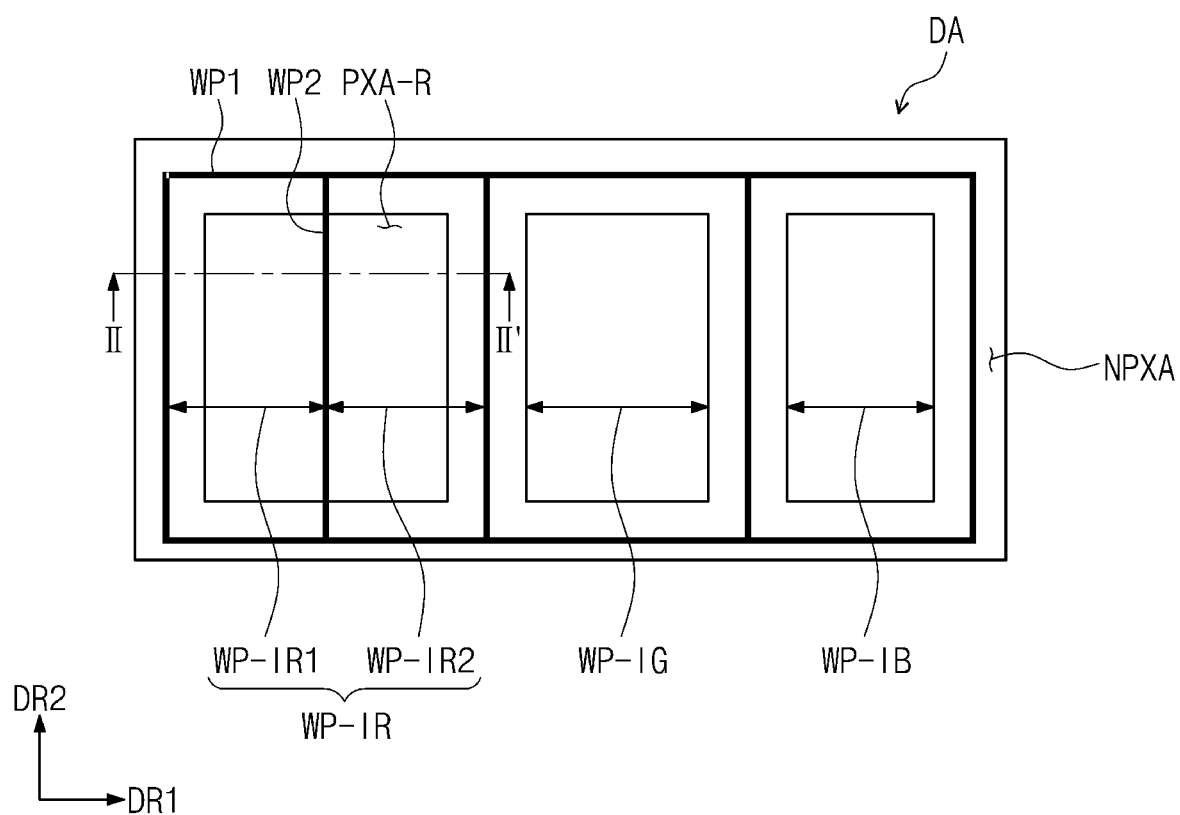
FIG. 4A is a plan view illustrating an arrangement relationship between pixel areas and partition walls according to an embodiment of the inventive concept.
Figure 4B:
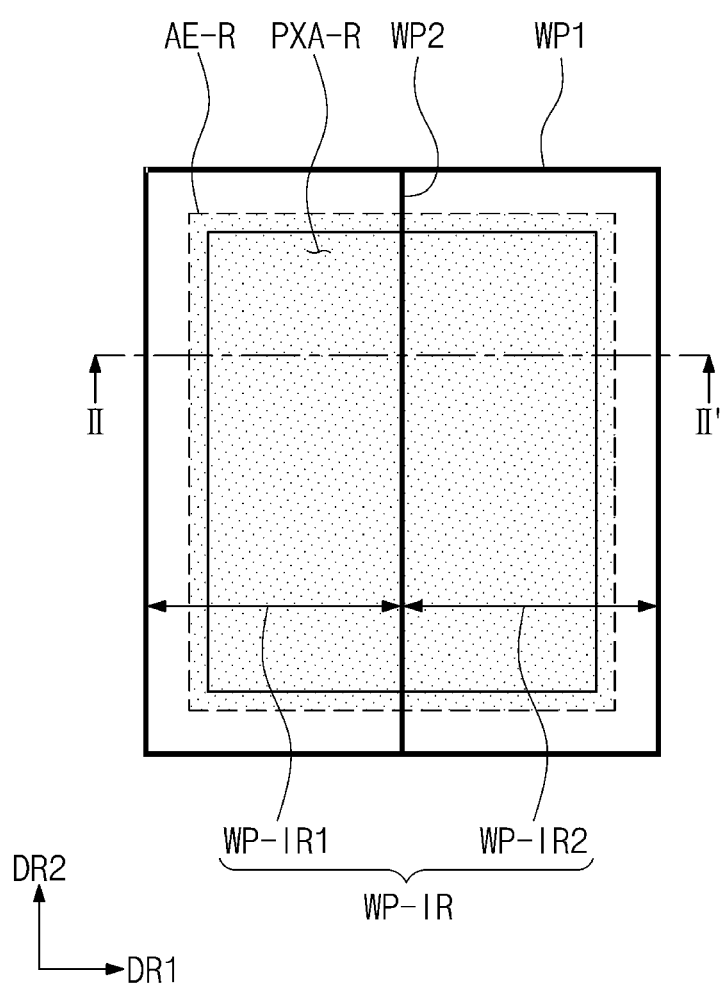
FIG. 4B is a plan view illustrating an arrangement relationship between a first electrode and a partition wall according to an embodiment of the inventive concept.
Figure 4C:
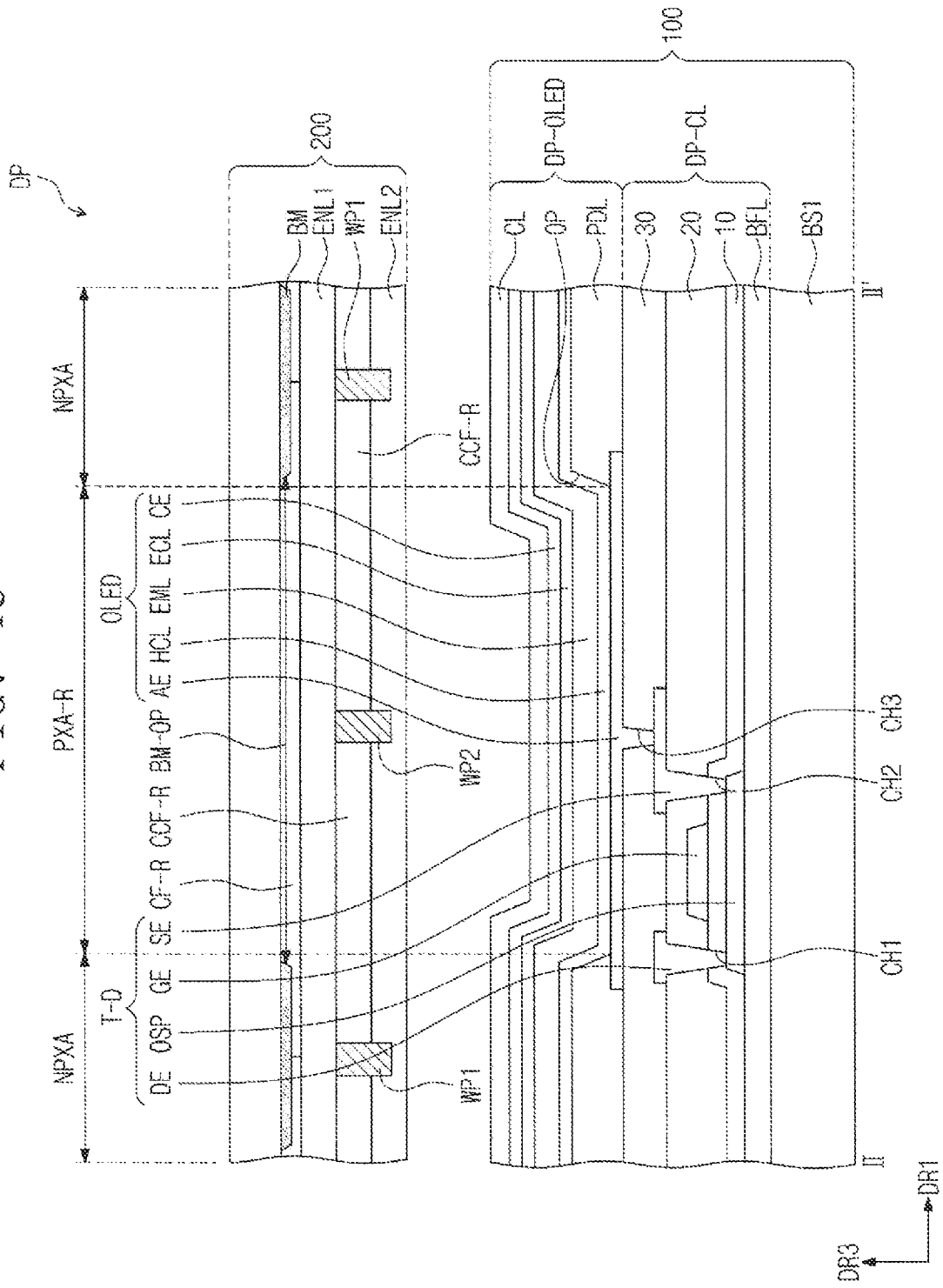
FIG. 4C is a cross-sectional view of a display panel corresponding to a first pixel area according to an embodiment of the inventive concept.

FIG. 4A is a plan view illustrating an arrangement relationship between the pixel areas PXA-R, PXA-G, and PXA-B and partition walls WP1 and WP2 according to an embodiment of the inventive concept. FIG. 4B is a plan view illustrating an arrangement relationship between a first electrode AE-R and the partition walls WP1 and WP2. FIG. 4C is a cross-sectional view of the display panel DP corresponding to the first pixel area PXA-R.

According to an embodiment, the partition wall WP includes the first partition wall WP1 and the second partition wall WP2 extending from the first partition wall WP1. In an embodiment, the first partition wall WP1 and the second partition wall WP2 may be formed through a same process and be defined as a first portion and a second portion of the partition wall WP.

The first partition wall WP1 overlaps the light blocking area NPXA. The first partition wall WP1 defines first, second, and third internal regions WP-IR, WP-IG, and WP-IB corresponding to the first, second, and third pixel areas PXA-R, PXA-G, and PXA-B. In an embodiment, the first partition wall WP1 may form a closed line for each of the first, second and third pixel areas PXA-R, PXA-G and PXA-B.

The second partition wall WP2 overlaps at least one area of the first, second, and third pixel areas PXA-R, PXA-G, and PXA-B, and at least one region of the first, second, and third internal regions WP-IR, WP-IG, and WP-IB may be partitioned into partial regions.

According to an embodiment, the second partition wall WP2 may partition the first internal region WP-IR into two partial regions WP-IR1 and WP-IR2. In an embodiment, the second partition wall WP2 extends from one side of the first partition wall WP1 to the other side of the first partition wall WP1 in the second direction DR2.

In an embodiment, the second partition wall WP2 may overlap the widest first pixel area PXA-R to compensate reduction of luminance due to the second partition wall WP2 through an increase of a low driving voltage. This may be because of the first pixel area PXA-R having a light receiving area greater than those of other pixel areas PXA-G and PXA-B.

FIG. 4B illustrates the first electrode AE-R overlapping the first pixel area PXA-R; and FIG. 4C illustrates the lower display substrate 100 corresponding to FIG. 3B and the upper display substrate 200 corresponding to FIG. 3C. The second partition wall WP2 overlaps the first electrode AE-R. The second partition wall WP2 may extend in the second direction DR2. In an embodiment, the second partition wall WP2 may be disposed at a position by which the first electrode AE-R is bisected (bisected or substantially bisected) in the first direction DR1. In an embodiment, the second partition wall WP2 may be disposed on an area overlapping a range of about 45% to about 55% with respect to a width of the first electrode AE-R in the first direction DR1.

The two partial regions WP-IR1 and WP-IR2 may have substantially the same surface area on the plane. The planar area may be calculated as a surface area of an area defined by inner edges of the first partition wall WP1 and the second partition wall WP2.

The color conversion layers CCF-R made of the same material are disposed in the two partial regions WP-IR1 and WP-IR-2, respectively. In an embodiment, the color conversion layer CCF-R may be quantum dots that absorb the blue light to generate the red light.

Figure 5:
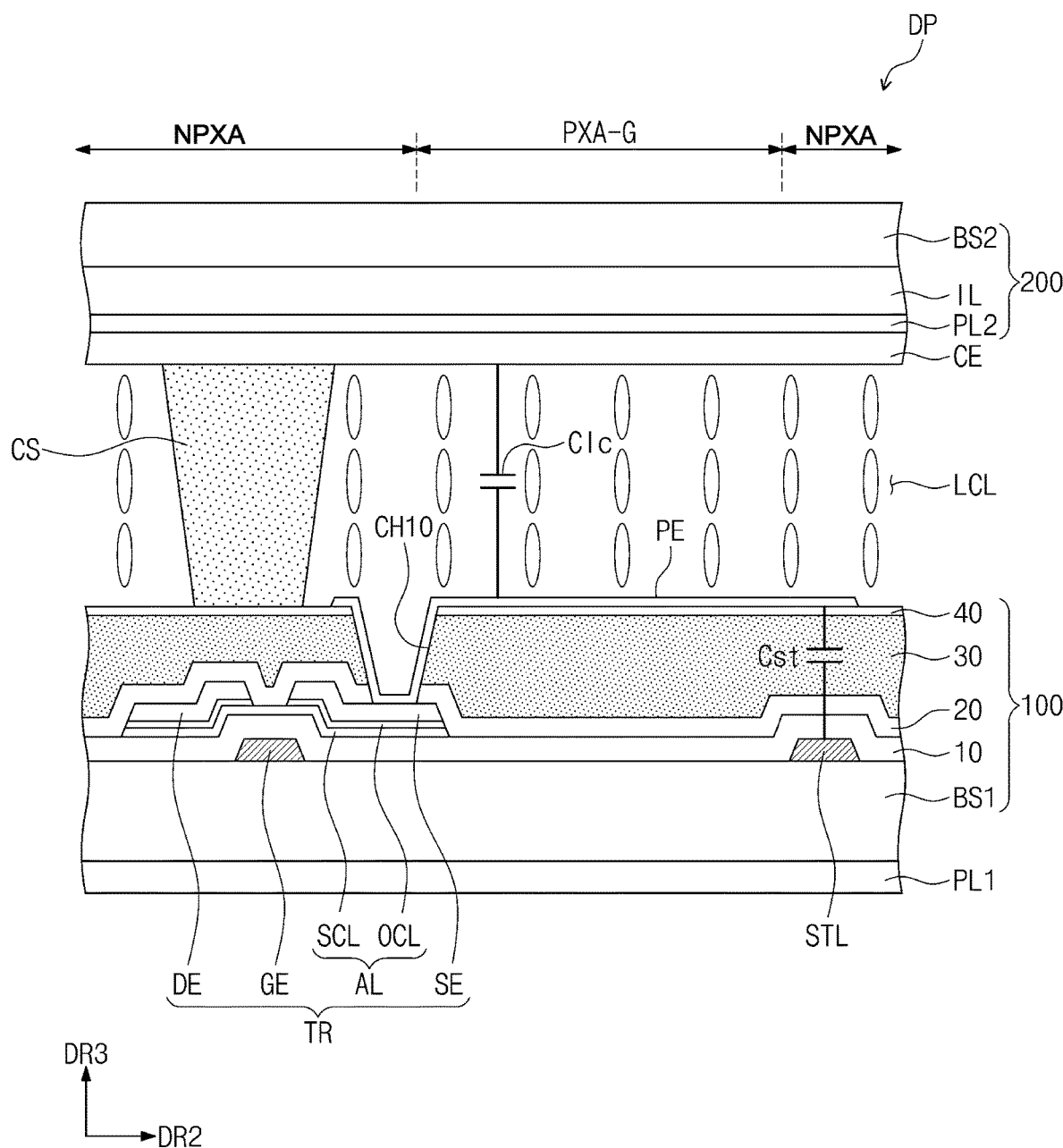
FIG. 5 is a cross-sectional view of a display panel according to an embodiment of the inventive concept.

FIG. 5 is a cross-sectional view of the display panel DP according to an embodiment of the inventive concept. Herein, further detailed description with respect to the same components as described with reference to FIGS. 1A to 4C will be omitted.

FIG. 5 illustrates a cross-section corresponding to one pixel area PXA-G, like FIG. 4C. In this embodiment, the liquid crystal display panel DP is illustrated as an example. The pixel of the liquid crystal display panel may include a transistor TR, a liquid crystal capacitor Clc, and a storage capacitor Cst in an equivalent circuit.

The liquid crystal display panel DP includes a first display substrate 100, a second display substrate 200, and a liquid crystal layer disposed between the first and second display substrates 100 and 200. A spacer CS overlapping the light blocking area NPXA may be disposed between the first display substrate 100 and the second display substrate 200. In an embodiment, the liquid crystal display panel DP includes first and second polarizer layers PL1 and PL2. The first polarizer layer PL1 may be disposed below the first display substrate 100, and the second polarizer layer PL2 may constitute the second display substrate 200. In an embodiment, the second polarizer layer PL2 may include a wire grid.

The control electrode GE and a storage line STL are disposed on one surface of a first base substrate BS1. The first base substrate BS1 may be a glass substrate or a plastic substrate. A first insulation layer 10 covering the control electrode GE and the storage line STL is disposed on one surface of the first base substrate BS1. The first insulation layer 10 may include at least one of an inorganic material and an organic material. An activation part AL overlapping the control electrode GE is disposed on the first insulation layer 10. The activation part AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may include an amorphous silicon or a polysilicon. Also, the semiconductor layer SCL may include a metal oxide semiconductor. The ohmic contact layer OCL may include a dopant doped at a density higher than that of the semiconductor layer SCL. The ohmic contact layer OCL may include two portions spaced apart from each other. In an embodiment of the inventive concept, the ohmic contact layer OCL may have an integrated shape.

An input electrode DE and an output electrode SE are disposed on the activation part AL. The input electrode DE and the output electrode SE are disposed to be spaced apart from each other. A second insulation layer 20 covering the activation layer AL, the input electrode DE, and the output electrode SE is disposed on the first insulation layer 10. A third insulation layer 30 is disposed on the second insulation layer 20. Each of the second insulation layer 20 and the third insulation layer 30 may include at least one of an inorganic material or an organic material. The third insulation layer 30 is disposed on the second insulation layer 20. The third insulation layer 30 may be an organic layer providing a polarization surface. A fourth insulation layer 40 is disposed on the third insulation layer 30. The fourth insulation layer 40 may be an inorganic layer.

As illustrated in FIG. 5, a pixel electrode PE is disposed on the fourth insulation layer 40. The pixel electrode PE is connected to the output electrode SE through a contact hole CH10 passing through the second insulation layer 20, the third insulation layer 30, and the fourth insulation layer 40. An alignment layer (not shown) covering the pixel electrode PE may be disposed on the fourth insulation layer 40.

A second base substrate BS2 may be a glass substrate or a plastic substrate. An intermediate layer IL, the second polarizer layer PL2, and a common electrode CE are disposed on a bottom surface of the second base substrate BS2. The liquid crystal capacitor Clc may be charged or discharged such that the liquid crystal layer LCL operates. The first color light provided from the backlight unit may be selectively provided to the intermediate layer IL through the first polarizer layer PL1, the liquid crystal layer LCL, and the second polarizer layer PL2.

Although the intermediate layer IL is schematically illustrated in this embodiment, the intermediate layer IL may have a laminated structure disposed on the bottom surface of the second base substrate BS2, which is described with reference to FIGS. 3C to 3E. For example, the intermediate layer IL may have the laminated structure from the black matrix BM to the second encapsulation layer ENL2 as illustrated in FIG. 3C.

The configuration of the first to third pixel areas PXA-R, PXA-G, and PXA-B, which is described with reference to FIGS. 4A to 4C, may also be equally applied to the second display substrate 200 of the liquid crystal display panel DP.

The cross-section illustrated in FIG. 5 may be merely one example. Although a liquid crystal display panel in a vertical alignment (VA) mode is exemplarily described in FIG. 5, according to an embodiment of the inventive concept, a liquid crystal display panel in an in-plane switching (IPS) mode, a fringe-field switching (FFS) mode, a planar to linear switching (PLS) mode, a super vertical alignment (SVA), or a surface-stabilized vertical alignment (SS-VA) mode may be applied.

Figure 6:
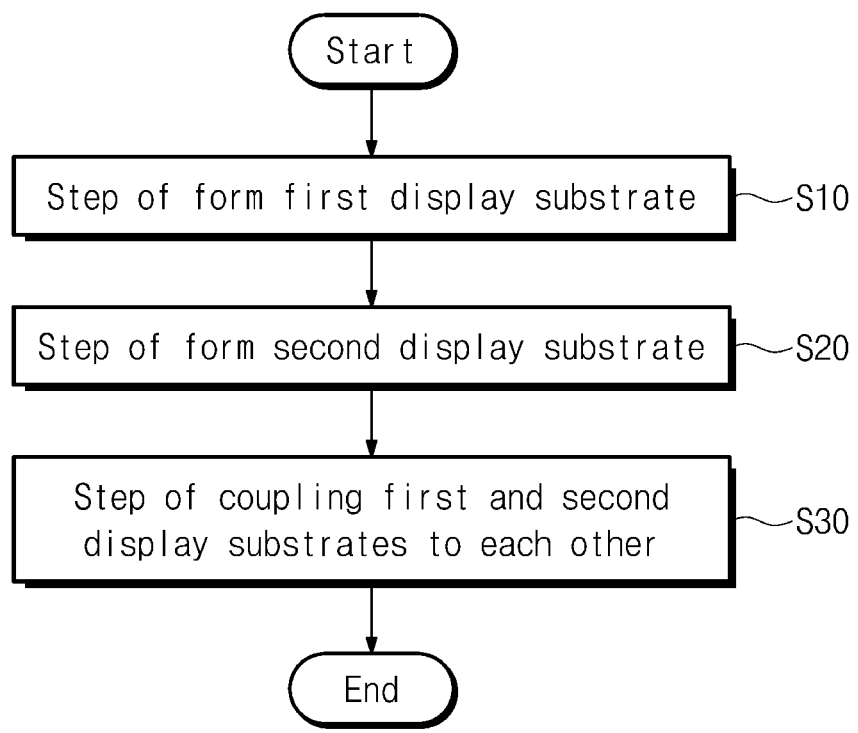
FIG. 6 is a flowchart illustrating a method for fabricating a display panel according to an embodiment of the inventive concept.

FIG. 6 is a flowchart illustrating a method for fabricating a display panel DP according to an embodiment of the inventive concept; and FIGS. 7A to 7I are views illustrating a method for fabricating an upper display substrate 200 according to an embodiment of the inventive concept. Herein, further detailed description with respect to the same components as described with reference to FIGS. 1A to 5 will be omitted.

Referring to FIG. 6, a first display substrate including first to third display elements is fabricated (S10). The first display substrate may be the lower display substrate 100 described with reference to FIGS. 1A to 5, i.e., an array substrate. The first display substrate may be fabricated through a well-known method. The organic light emitting display panel DP illustrated in FIGS. 3C to 3E may form an organic light emitting diode as the display element, and the liquid crystal display panel DP of FIG. 5 may form a pixel electrode PE as the display element.

Also, a second display substrate is fabricated (S20). However, the order of fabricating the first display substrate and the second display substrate is not specifically limited.

Then, the first display substrate and the second display substrate are coupled to each other (S30). A preliminary sealant may be formed on one non-display area NDA (see FIG. 1A) of the first display substrate and the second display substrate, and, then, the first display substrate and the second display substrate may be coupled to each other. After being coupled, the preliminary sealant may be cured. To fabricate the liquid crystal display panel, a process of providing a liquid crystal composition to one display area DA (see FIG. 1A) of the first display substrate and the second display substrate may be further performed. According to an embodiment, after the first display substrate and the second display substrate are coupled to each other, the liquid crystal composition may be injected into a gap.

A method for fabricating a second display substrate 200 will be described in further detail with reference to FIGS. 7A to 7I. FIGS. 7A to 7I illustrate a cross-section corresponding to FIG. 3C.

Figure 7A:
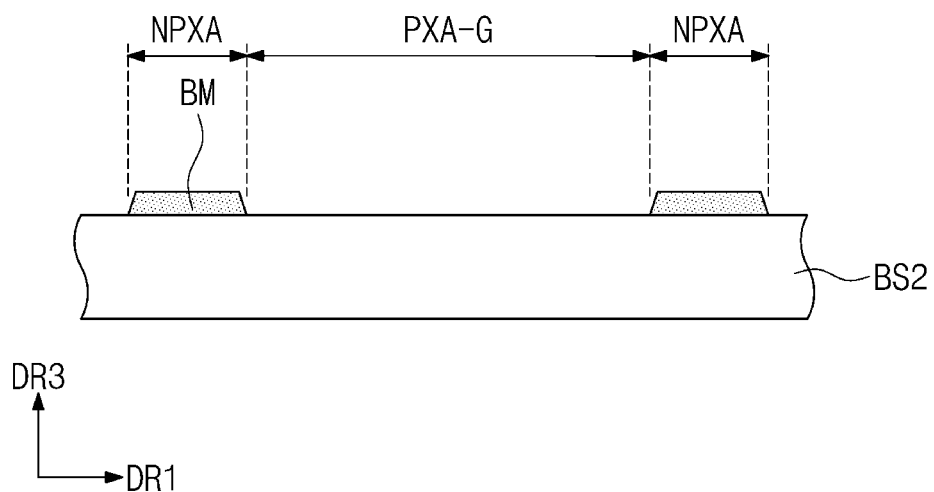
FIGS. 7A to 7I are views illustrating a method for fabricating an upper display substrate according to an embodiment of the inventive concept.

As illustrated in FIG. 7A, a black matrix BM is formed on a base substrate BS2. In an embodiment of the inventive concept, an organic material having a specific color may be printed on a portion of an area of the base substrate BS2 to form the black matrix BM. In an embodiment of the inventive concept, an organic layer having a specific color may be formed on one surface of the base substrate BS2 and then be exposed and developed to form the black matrix BM.

Figure 7B:
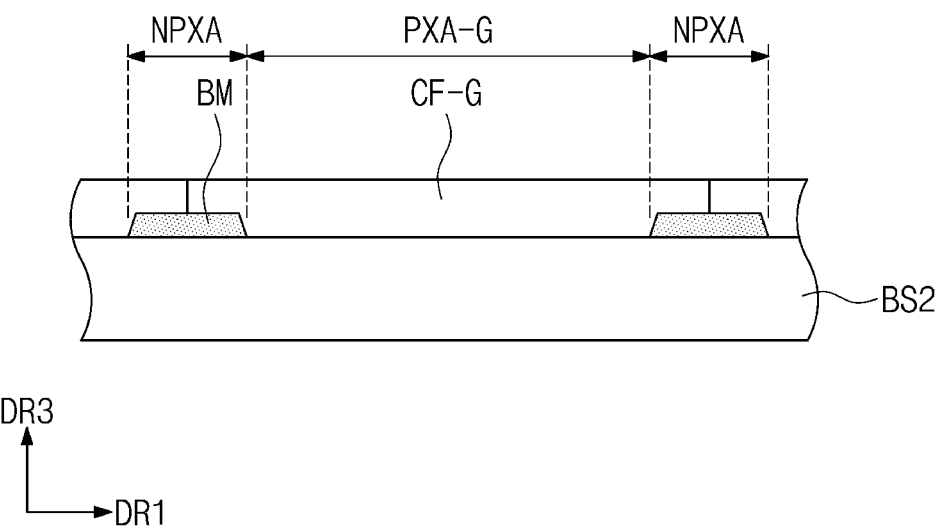

As illustrated in FIG. 7B, a color filter CF-G is formed on the base substrate BS2. In an embodiment of the inventive concept, an organic layer having a specific color may be formed on one surface of the base substrate BS2 and then be exposed and developed to form the color filter CF-G. To form three kinds of color filters, each of the process of forming the organic layer and the process of patterning the organic layer may be performed three times.

Figure 7C:
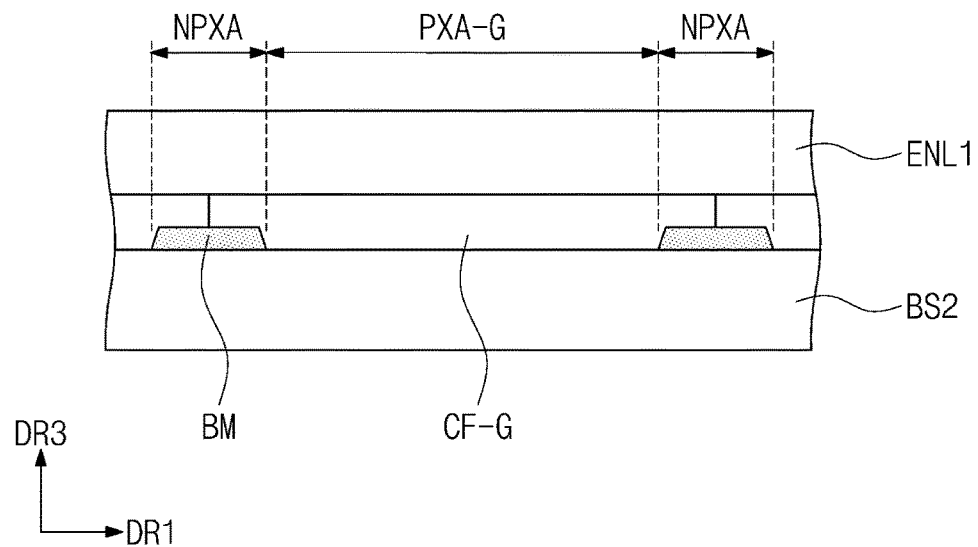

As illustrated in FIG. 7C, a first encapsulation layer ENL1 is formed on the base substrate BS2. The first encapsulation layer ENL1 is commonly formed on a light blocking area NPXA and first to third pixel areas PXA-R, PXA-G, and PXA-B (see FIG. 4A). An inorganic material may be deposited to from an inorganic encapsulation layer. An organic material may be deposited or applied to form an organic encapsulation layer.

Figure 7D:
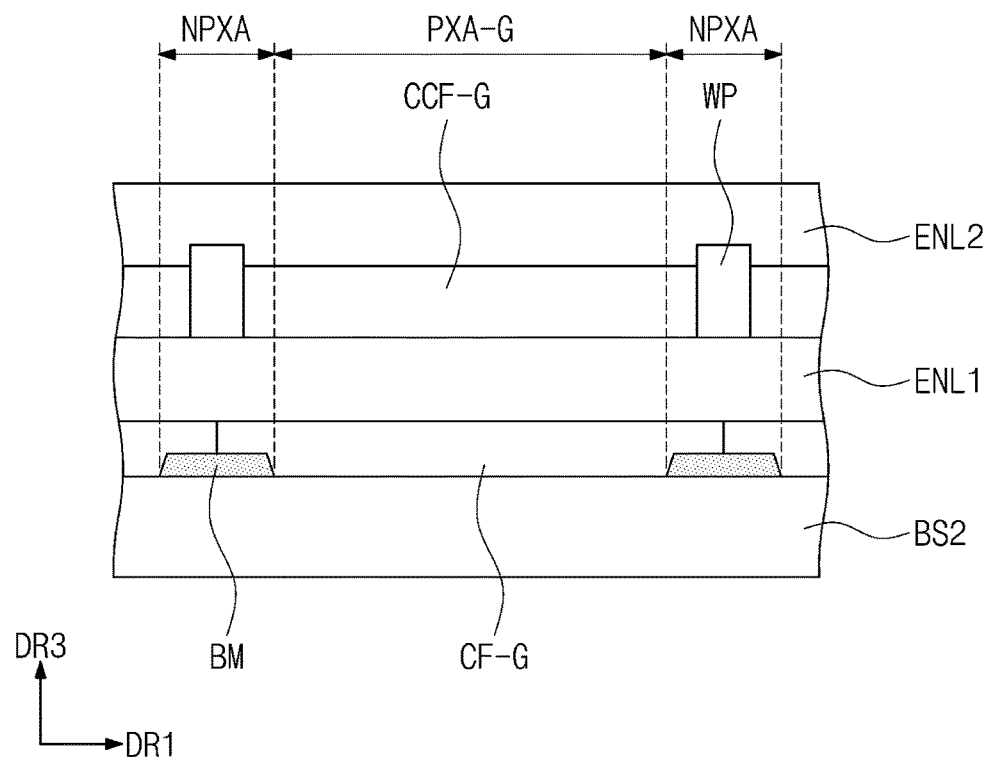

As illustrated in FIG. 7D, partition walls WP1 and WP2 are formed on the first encapsulation layer ENL1. The organic layer is formed on the first encapsulation layer ENL1 and then is exposed and developed such that the organic layer is patterned. First, second, and third internal regions WP-IR, WP-IG, and WP-IB are defined.

The first partition wall WP1 and the second partition wall WP2, which are illustrated in FIG. 4A, may be formed at the same time. Thus, two partial regions WP-IR1 and WP-IR2 of the first internal region WP-IR are defined.

Figure 7E:
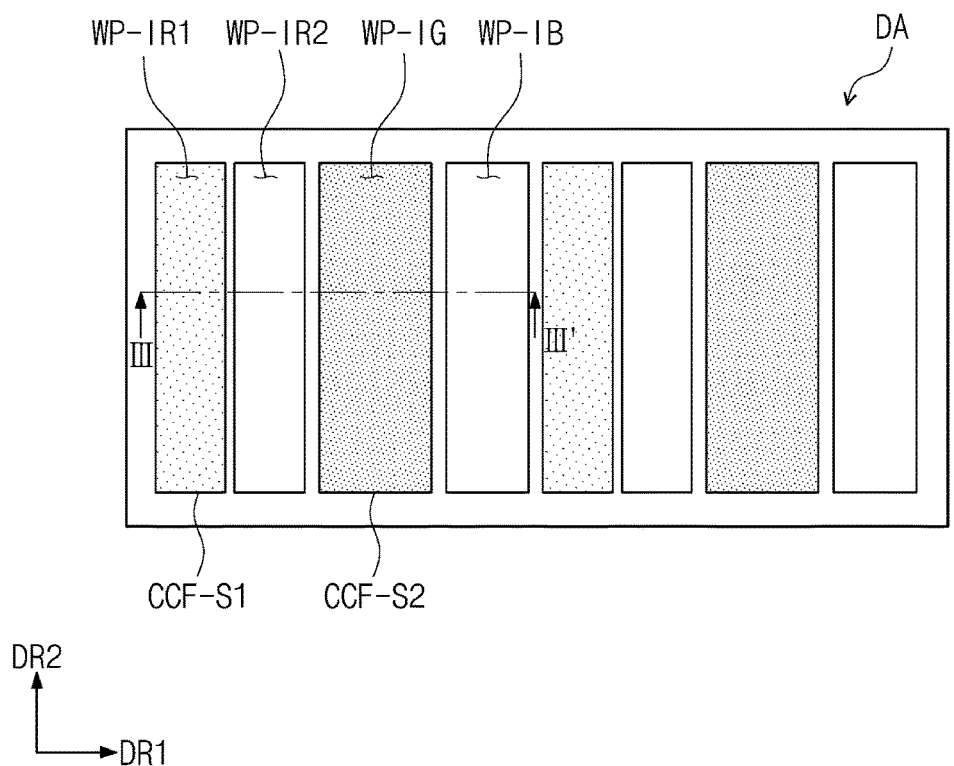
Figure 7F:
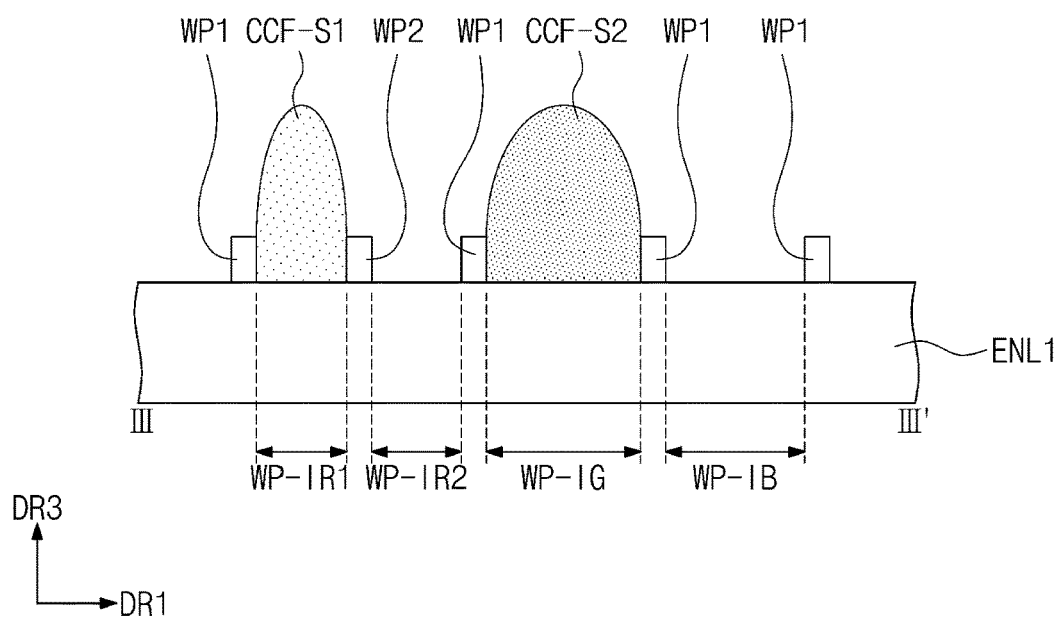

As illustrated in FIGS. 7E and 7F, a color control layer is formed in a portion of the first, second, and third regions WP-IR, WP-IG, and WP-IB. In an embodiment, the color control layer may be a color conversion layer. FIGS. 7E and 7F illustrate two pairs of first to third pixel areas PXA-R, PXA-G, and PXA-B, which are arranged in the first direction DR1.

As illustrated in FIGS. 7E and 7F, a first color composition CCF-S1 is provided in a first partial region WP-IR1 of the first internal region WP-IR, and a second color composition CCF-S2 different from the first color composition CCF-S1 is provided in the second internal region WP-IG. In an embodiment, the color compositions may be provided in an inkjet manner. The first color composition CCF-S1 and the second color composition CCF-S2 may be provided without overflowing over the first partition wall WP1 and the second partition wall WP2. Even though the first color composition CCF-S1 and the second color composition CCF-S2 may be provided in a large amount relative to a volume of a corresponding region or space, the first and second color compositions may not overflow due to surface tension. Although a large amount of the first color composition CCF-S1 and the second color composition CCF-S2 may be provided, since the second partial region WP-IR2 of the first internal region WP-IR is disposed between the first partial region WP-IR1 of the first internal region WP-IR and the second internal region WP-IG, mixing of the first color composition CCF-S1 and the second color composition CCF-S2 due to contact therebetween may be prevented or substantially prevented.

Each of the first color composition CCF-S1 and the second color composition CCF-S2 may include a solvent and a solid content dispersed in the solvent. In an embodiment, the solid content may be contained in a range of about 20 wt % to about 30 wt % on the basis of the color compositions. The kind of solvent is not specifically limited, and various known solvents may be used. For example, the solvent may be any of ketones, such as acetone, methyl ethyl ketone, and cyclohexanone, acetic acid esters, such as ethyl acetate, butyl acetate, cellosolve acetate, propylene glycol monomethyl ether acetate, and carbitol acetate, cellosolves, such as cellosolve and butyl carbitol, aromatic hydrocarbons, such as solvent naphtha, toluene and xylene, amide solvents, such as dimethylformamide, dimethylacetamide and N-methylpyrrolidone, and the like. In an embodiment, two kinds of solvents may be combined to be used.

In an embodiment, the solid content includes a base resin and quantum dots. The base resin may include an epoxy-based polymer and/or a monomer. The solid content may further include scattering particles. The first color composition CCF-S1 and the second color composition CCF-S2 include quantum dots different from each other.

The first color composition CCF-S1 and the second color composition CCF-S2 may be dried in a vacuum state to form a first preliminary color control layer and a second preliminary color control layer. When a chamber in which the first color composition CCF-S1 and the second color composition CCF-S2 are disposed is changed into the vacuum state, the solvents of the compositions are removed.

The first preliminary color control layer and the second preliminary color control layer may be baked at a first temperature (a first baking process). In an embodiment, the first temperature may be about 90° C. to 130° C. The first preliminary color control layer and the second preliminary color control layer may be baked at a second temperature greater than the first temperature (a second baking process). In an embodiment, the second temperature may be about 180° C. to 240° C. The two-stage baking processes may be performed to form the color conversion layer that is uniformly dried.

Figure 7G:
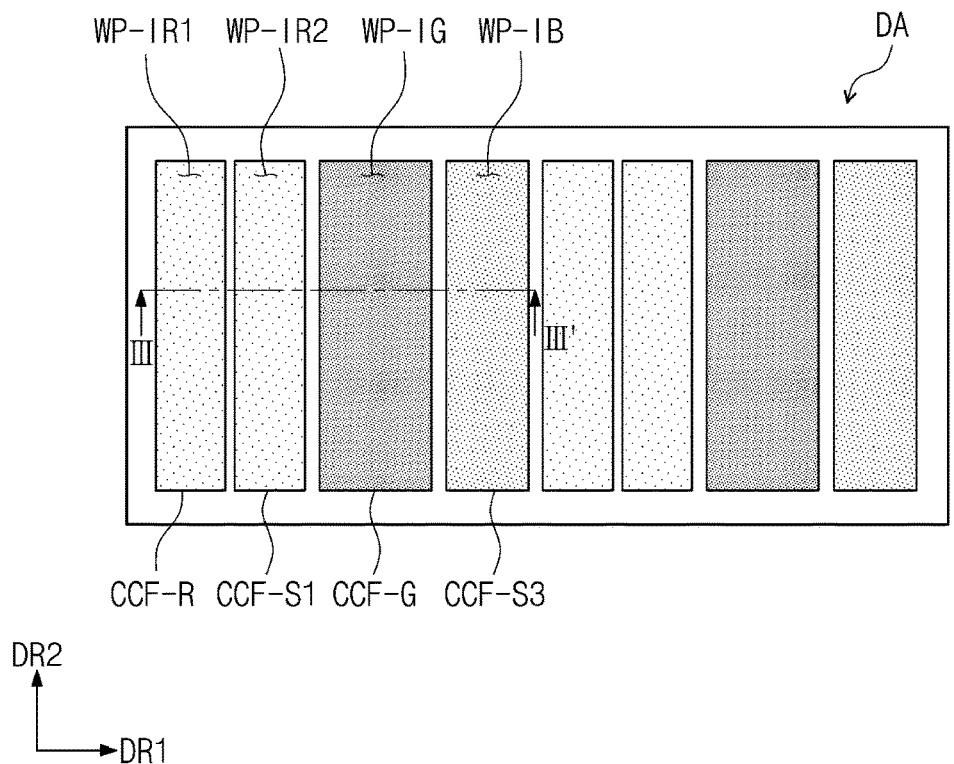
Figure 7H:
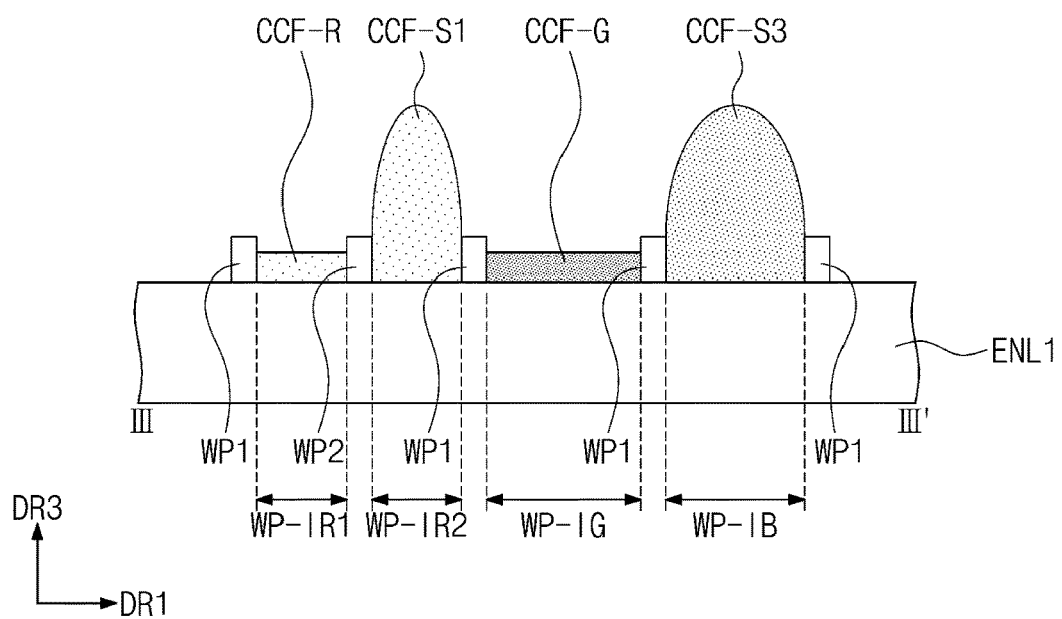

As illustrated in FIGS. 7G and 7H, the conversion layer is formed in remaining portions of the first, second, and third regions WP-IR, WP-IG, and WP-IB. As illustrated in FIGS. 7G and 7H, the first color composition CCF-S1 is provided in a second partial region WP-IR2 of the first internal region WP-IR, and a third color composition CCF-S3 different from the first color composition CCF-S1 and the second color composition CCF-S2 is provided in the third internal region WP-IB. The first color composition CCF-S1 and the third color composition CCF-S3 may not be mixed with each other because of the same reason as that in which the color composition CCF-S1 and the second color composition CCF-S2 are not mixed with each other.

The third color composition CCF-S3 includes a solvent and a solid content dispersed in the solvent. In an embodiment, the solid content may be contained in a range of about 20 wt % to about 30 wt % on the basis of the color compositions. The solid content may include a base resin and scattering particles. As described above, the vacuum drying and the two-stage baking processes may be performed to form the uniformly dried color conversion layer.

Figure 7I:
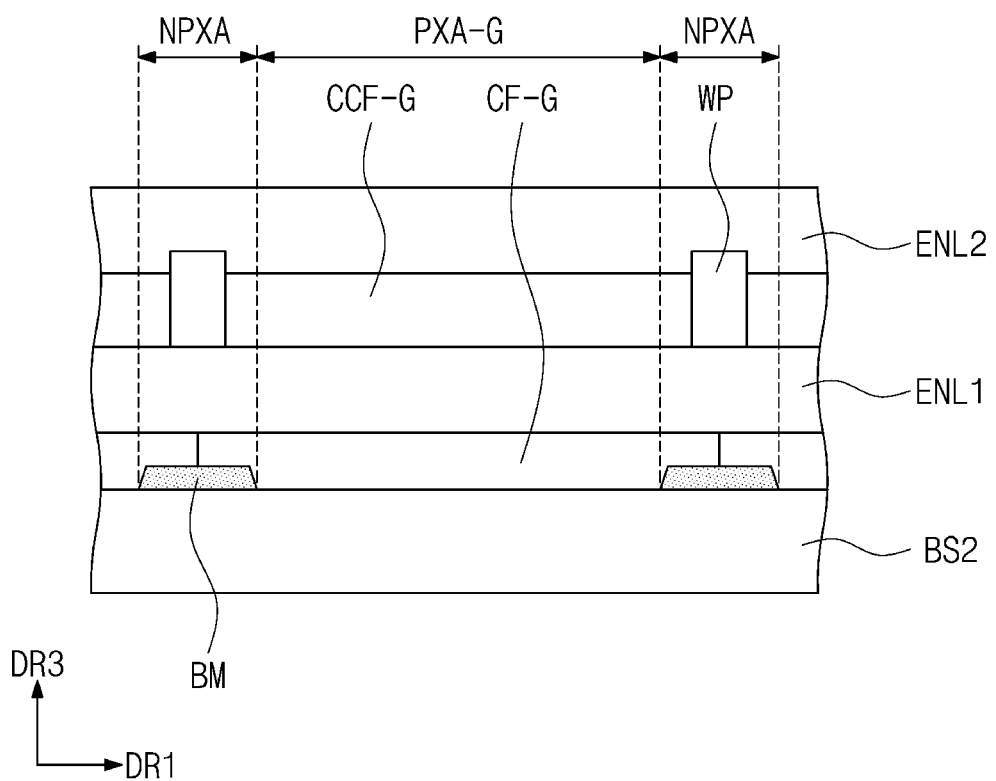

As illustrated in FIG. 7I, a second encapsulation layer ENL2 is formed on the partition wall WP. An inorganic material may be deposited to from an inorganic encapsulation layer. An organic material may be deposited or applied to form an organic encapsulation layer. As illustrated in FIGS. 7A to 7I, according to an embodiment, three kinds of color control layers may be formed through the two-stage inkjet processes. Thus, a time taken to fabricate the display panel may be reduced.

In an embodiment, although separately not shown, in the upper display substrate 200 of FIG. 3D, a process of forming the color filer CF-G and the first encapsulation layer ENL1 may be omitted when compared to the fabrication method of FIGS. 7A to 7I. The partition wall WP may be directly formed on the black matrix BM. The subsequent processes may be the same as described above.

The upper display substrate 200 of FIG. 3E further includes a process of forming the partition wall WP-S when compared to the fabrication method of FIGS. 7A to 7I. The process of forming the partition wall WP-S may be the same as the method for fabricating the partition wall WP, which is described with reference to FIG. 7D. In an embodiment, the partition wall WP-S and the partition wall WP include a same material and have a same structure.

The color filters may be formed in an internal region of the partition wall WP-S. The color filters may include a first color filter disposed in the two partial regions defined by the partition wall WP-S and second and third color filters disposed in the internal regions defined by the partition wall WP-S.

The method for forming the first to third color filters may be the same as that for fabricating the color conversion layers CCF-R, CCF-G, and CCF-B described with reference to FIGS. 7E to 7H. Each of the compositions for forming the first to third color filters includes a solvent and a solid content dispersed in the solvent. The solid content may include a base resin and a dye and/or pigment.

In an embodiment of the present invention, the second display substrate 200 may be omitted. The display panel DP may include one base substrate, and the one base substrate may be the first base substrate BS1 shown in FIG. 3B. The thin film encapsulation layer can cover the display element layer DP-OLED in FIG. 3B. The thin film encapsulation layer comprises at least one inorganic layer. The thin film encapsulation layer may comprise at least one inorganic layer and at least one organic layer.

An additional insulating layer may be disposed on the thin-film encapsulation layer. Either the thin film encapsulation layer or the additional insulating layer provides a base surface. A partition wall WP is disposed on the base surface. And a color conversion layer CCF-G is formed inside the partition WP. The manufacturing method of the color conversion layer CCF-G is the same as that of FIGS. 7E to 7H. The first encapsulation layer ENL1 shown in FIGS. 7E to 7H may be the above-described thin film encapsulation layer or an additional insulation layer providing the base surface in this embodiment.

An additional encapsulation layer may be formed on the color conversion layer CCF-G. A color filter CF-R and a black matrix BM are formed on the additional encapsulation layer. An insulating layer covering the black matrix BM and the color filter CF-R may be further formed to provide a flat surface.

Figure 8A:
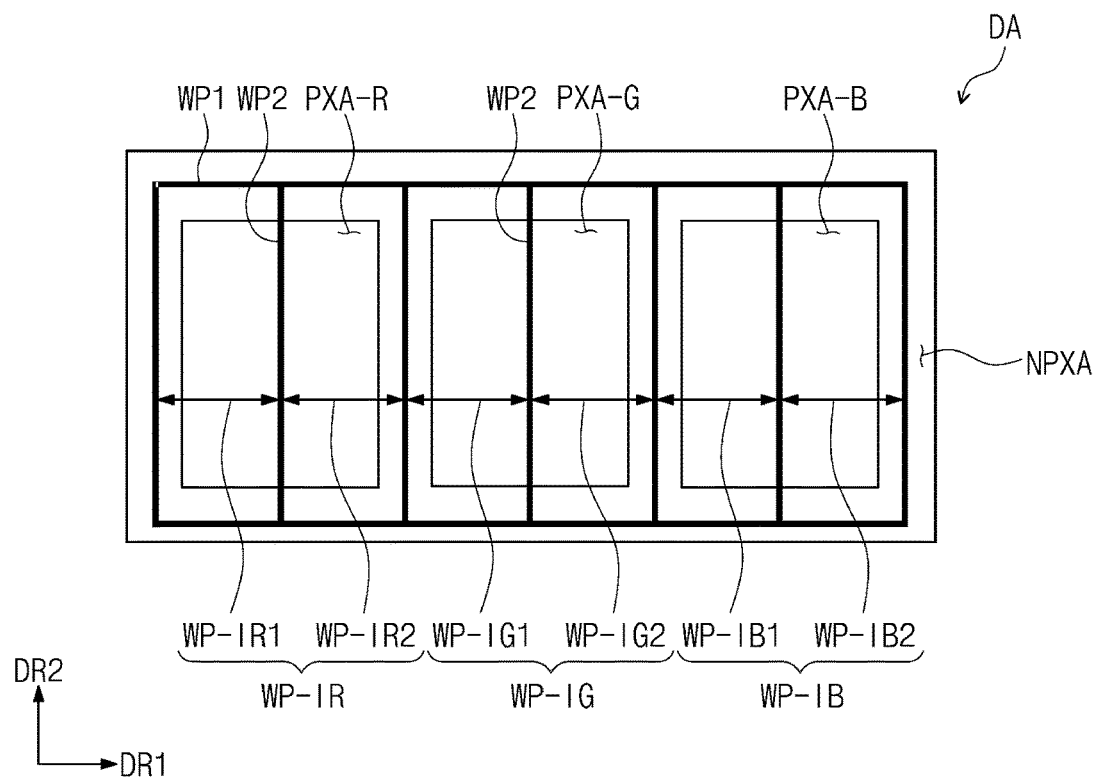
FIG. 8A is a plan view illustrating an arrangement relationship between pixel areas and partition walls according to an embodiment of the inventive concept.
Figure 8B:
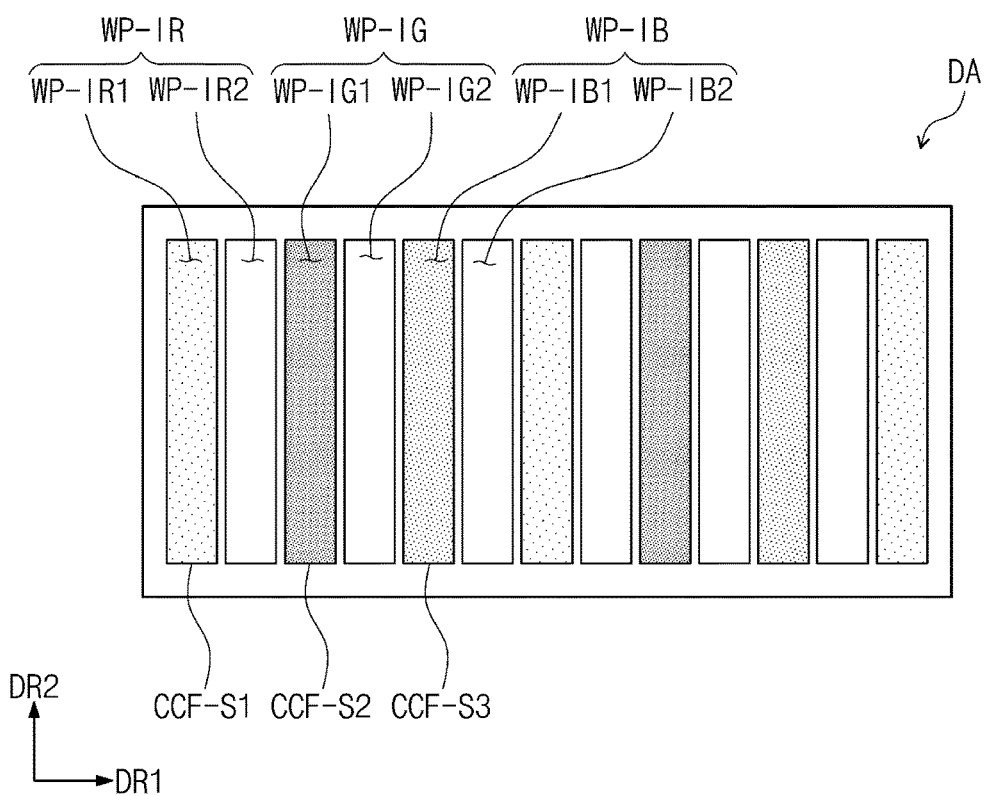
FIGS. 8B to 8C are views illustrating a method for fabricating an upper display substrate according to an embodiment of the inventive concept.
Figure 8C:
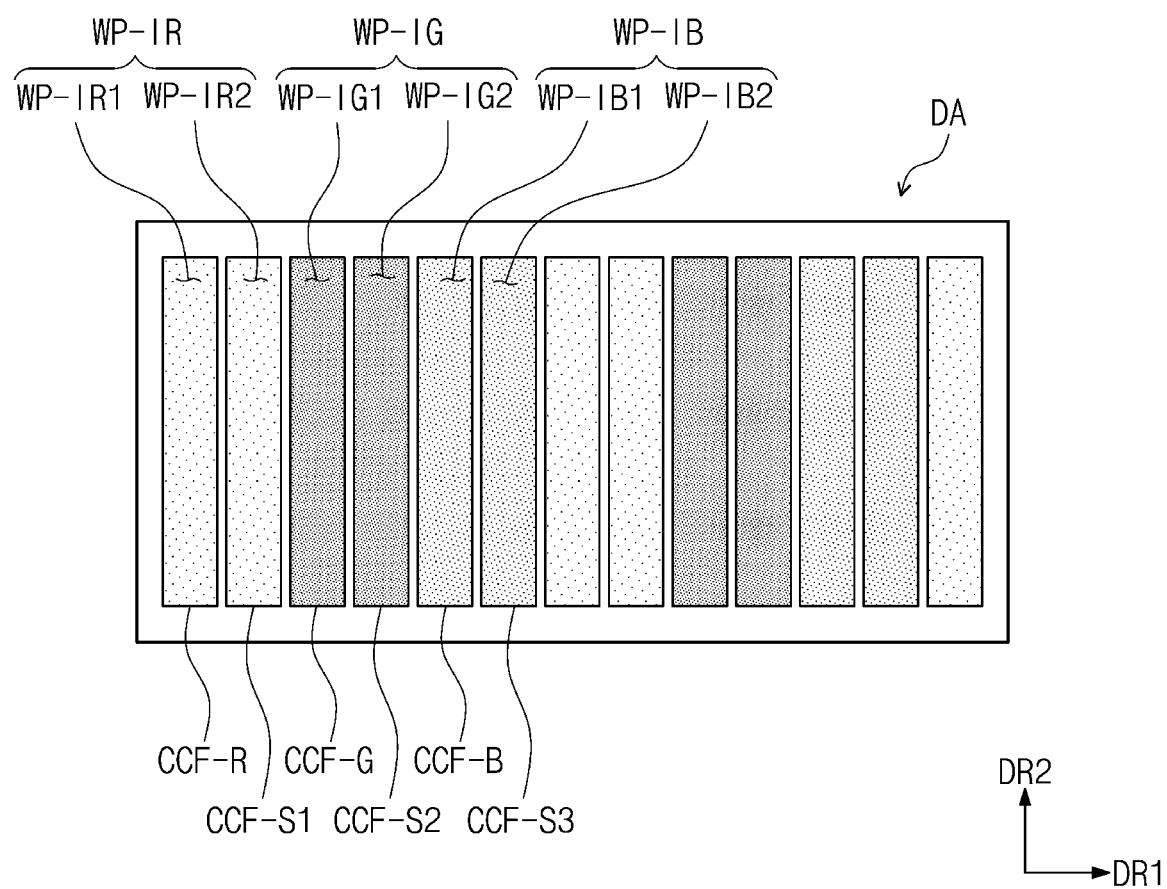

FIG. 8A is a plan view illustrating an arrangement relationship between the pixel areas PXA-R, PXA-G, and PXA-B and the partition walls WP1 and WP2 according to an embodiment of the inventive concept. FIGS. 8B to 8C are views illustrating a method for fabricating the upper display substrate 200 according to an embodiment of the inventive concept.

FIG. 8A illustrates an example of the pixel areas PXA-R, PXA-G, and PXA-B having a same surface area. The second partition wall WP2 may partition each of the first, second, and third internal regions WP-IR, WP-IG, WP-IB into two partial regions WP-IR1, WP-IR2, WP-IG1, WP-IG2, WP-IB1, and WP-IB2.

In an embodiment, the method for fabricating the upper display substrate 200 is very similar to that described with reference to FIGS. 7A to 7I. As illustrated in FIGS. 8B and 8C, a color control layer is formed in each of the regions WP-IR2, WP-IG2, and WP-IB2, which remain after a color control layer is formed in each of partial regions of the first, second, and third internal regions WP-IR, WP-IG, and WP-IB.

As illustrated in FIG. 8B, a first color composition CCF-S1 is provided in a first partial region WP-IR1 of the first internal region WP-IR, a second color composition CCF-S2 is provided in a first partial region WP-IG1 of the second internal region WP-IG, and a third color composition CCF-S3 is provided in a first partial region WP-IB1 of the third internal region WP-IB. The vacuum drying and the two-stage baking processes may be performed to form three kinds of color conversion layers that are uniformly dried.

Although a first color composition CCF-S1, a second color composition CCF-S2, and a third color composition CCF-S3 may be provided in a large amount relative to volumes of the partial regions WP-IR1, WP-IG1, and WP-IB1, since the empty regions WP-IR2, WP-IG2, and WP-IB2 are provided between the first partial regions WP-IR1, WP-IG1, and WP-IB1, the first color composition CCF-S1, the second color composition CCF-S2, and the third color composition CCF-S3 may be prevented or substantially prevented from being mixed with each other due to contact therebetween.

As illustrated in FIG. 8C, a first color composition CCF-S1 is provided in a second partial region WP-IR2 of the first internal region WP-IR, a second color composition CCF-S2 is provided in a second partial region WP-IG2 of the second internal region WP-IG, and a third color composition CCF-S3 is provided in a second partial region WP-IB2 of the third internal region WP-IB. The vacuum drying and the two-stage baking processes may be performed to form three kinds of color conversion layers that are uniformly dried.

As illustrated in FIGS. 8A to 8C, according to an embodiment, three kinds of color control layers may be formed through the two-stage inkjet processes. Thus, a time taken to fabricate the display panel may be reduced.

As described above, the second partition wall may prevent or substantially prevent the color conversion material from being mixed between the pixel areas adjacent to each other in the fabrication process. Thus, the display panel may be reduced in defective rate.

The three kinds of color control layers may be formed through the two-stage inkjet process. Thus, the display panel may be reduced in fabrication time.

It will be apparent to those skilled in the art that various modifications and variations can be made in the inventive concept. Thus, it is intended that the present disclosure covers all modifications and variations of this invention that are within the scope of the appended claims and their equivalents.

Hence, the protective scope of the inventive concept shall be determined by the technical scope of the accompanying claims.

What is claimed is:

1. A display panel comprising:
an upper display substrate comprising first, second, and third pixel areas configured to emit light of different colors, and a light blocking area around the first, second, and third pixel areas; and
a lower display substrate comprising first, second, and third display elements corresponding to the first, second, and third pixel areas,
wherein the upper display substrate comprises:
a base substrate;
a first partition wall on the base substrate, overlapping the light blocking area, and configured to define first, second, and third internal regions corresponding to the first, second, and third pixel areas;
first, second, and third color control layers respectively located in the first, second, and third internal regions; and
a second partition wall overlapping at least one pixel area of the first, second, and third pixel areas, and configured to partition at least one internal region of the first, second, and third internal regions into partial regions such that lower surfaces of at least one color control layer of the first, second, and third color control layers located in the partial regions are spaced apart from each other with the second partition wall therebetween.

2. The display panel of claim 1, wherein each of the first, second, and third display elements comprises a first electrode, a second electrode, and a light emitting layer between the first electrode and the second electrode, and
the light emitting layers of the first, second, and third display elements have an integrated shape to generate blue light.

3. The display panel of claim 2, wherein the first color control layer comprises a first quantum dot to convert the blue light into red light,
the second color control layer comprises a second quantum dot to convert the blue light into green light, and
the third color control layer is configured to transmit the blue light.

4. The display panel of claim 3, wherein the upper display substrate further comprises:
a black matrix on the base substrate to overlap the light blocking area;
red, green, and blue color filters on the base substrate to respectively correspond to the first, second, and third pixel areas;
a first encapsulation layer covering the red color filter, the green color filter, and the blue color filter; and
a second encapsulation layer covering the first partition wall, the second partition wall, and the first, second, and third color control layers.

5. The display panel of claim 3, wherein the second partition wall partitions each of the first, second, and third internal regions into the partial regions.

6. The display panel of claim 3, wherein the first pixel area has a surface area greater than that of each of the second and third pixel areas on a plane.

7. The display panel of claim 3, wherein the at least one internal region partitioned by the second partition wall is the first internal region that is defined, together with the second and third internal regions, by the first partition wall, and
the second partition wall overlaps the first electrode of the first display element.

8. The display panel of claim 7, wherein the second partition wall extends in a first direction, and
the second partition wall is arranged such that the first electrode of the first display element is bisected in a second direction perpendicular to the first direction.

9. The display panel of claim 7, wherein the partial regions have a same surface area on a plane.

10. The display panel of claim 1, further comprising a liquid crystal layer between the upper display substrate and the lower display substrate.

11. The display panel of claim 1, wherein the first color control layer comprises a red color filter,
the second color control layer comprises a green color filter, and
the third color control layer comprises a blue color filter.

* * * * *